United States Patent
Kummel et al.

(10) Patent No.: US 12,497,694 B2
(45) Date of Patent: Dec. 16, 2025

(54) METHOD OF FORMING LOW-RESISTIVITY Ru ALD THROUGH A BI-LAYER PROCESS AND RELATED STRUCTURES

(71) Applicants: The Regents of the University of California, Oakland, CA (US); Merck Patent GmbH, Darmstadt (DE); Samsung Electronics Co., Ltd., Suwon-si (KR)

(72) Inventors: Andrew Kummel, San Diego, CA (US); Michael Breeden, La Jolla, CA (US); Victor Wang, Whittier, CA (US); Ravindra Kanjolia, North Andover, MA (US); Mansour Moinpour, San Jose, CA (US); Harsono Simka, Saratoga, CA (US)

(73) Assignees: The Regents of the University of California, Oakland, CA (US); Merck Patent GmbH, Darmstadt (DE); Samsung Electronics Co., Ltd., Suwon-si (KR)

( * ) Notice: Subject to any disclaimer, the term of this patent is extended or adjusted under 35 U.S.C. 154(b) by 464 days.

(21) Appl. No.: 18/062,502

(22) Filed: Dec. 6, 2022

(65) Prior Publication Data

US 2023/0175133 A1 Jun. 8, 2023

Related U.S. Application Data

(60) Provisional application No. 63/367,017, filed on Jun. 24, 2022, provisional application No. 63/286,421, filed on Dec. 6, 2021.

(51) Int. Cl.
*C23C 16/455* (2006.01)
*C23C 16/18* (2006.01)
(Continued)

(52) U.S. Cl.
CPC ........ *C23C 16/45553* (2013.01); *C23C 16/18* (2013.01); *C23C 16/56* (2013.01);
(Continued)

(58) Field of Classification Search
None
See application file for complete search history.

(56) References Cited

U.S. PATENT DOCUMENTS

| 7,074,719 B2 | 7/2006 | Kim et al. |
| 10,266,398 B1 * | 4/2019 | Kubena ................ C23C 16/403 |

(Continued)

OTHER PUBLICATIONS

Chen et al. (2000) Thin Solid Films 376, 115.
(Continued)

*Primary Examiner* — Erik Kielin
(74) *Attorney, Agent, or Firm* — Stanek Lemon Crouse & Meeks, PA

(57) ABSTRACT

Described are low resistivity metal layers/films, such as low resistivity ruthenium (Ru) layers/films, and methods of forming low resistivity metal films. Ru layers/films with close-to-bulk resistivity can be prepared on substrates using Ru(CpEt)$_2$+O$_2$ ALD, as well as a two-step ALD process using Ru(DMBD)(CO)$_3$+TBA (tertiary butyl amine) to nucleate the substrate and Ru(EtCp)$_2$+O$_2$ to increase layer/film thickness. The Ru layer/films and methods of preparing Ru layers/films described herein may be suitable for use in barrierless via-fills, as well as at M0/M1 interconnect layers.

19 Claims, 13 Drawing Sheets

(51) Int. Cl.
  *C23C 16/56* (2006.01)
  *H01L 21/285* (2006.01)
  *H01L 23/522* (2006.01)
  *H01L 23/532* (2006.01)
(52) U.S. Cl.
  CPC .... *H01L 21/28568* (2013.01); *H01L 23/5226* (2013.01); *H01L 23/53209* (2013.01)

(56) References Cited

U.S. PATENT DOCUMENTS

2005/0070041 A1  3/2005  Wu et al.
2010/0003406 A1  1/2010  Lam et al.
2016/0305024 A1* 10/2016 Lee ................... H01L 23/53228
2019/0185993 A1  6/2019  Chen et al.

OTHER PUBLICATIONS

Josell et al. (2009) Ann. Rev. Mater. Res. 39, 231.
Gall (2016) J. Appl. Phys. 119, 085101.
Kwak et al. (1999) Thin Solid Films 339, 290.
Lane et al. (2011) J. Mater. Res. 15, 203.
Van der Veen et al. (2018) Proc. of the IITC 2018 DOI: 10.1109/IITC.2018.8430407.
Gall (2020) J. Appl. Phys. 127, 050901.
Pedreira et al. (2017) IEEE IRPS 2017 DOI: 10.1109/IRPS.2017.7936340.
Murdoch et al. (2020) IEEE IITC 2020 DOI: 10.1109/IITC47697.2020.9515597.
Lee et al. (2003) Mater. Chem. and Phys. 82, 984.
Green et al. (1985) J. Elec. Soc. 132, 2677.
Khan et al. (2019) Chem. Mater. 30, 7603.
Mackus et al. Chem. Mater. (2019) 31, 2.
Aaltonen et al. Chem. Vap. Depos. (2003) 9, 45.
Kim et al. (2009) J. Korean Phys. Soc. 55, 32.
Popovici et al. Chem. Mater. (2017) 29, 4654.
Yim et al. (2008) J. Appl. Phys. 103, 113509.
Gao et al. (2019) Chem. Mater. 31, 1304.
Cwik et al. (2020) J. Vac. Sci. A 38, 012402.
Hayes et al. (2021) J. Vac. Sci. A 39, 052402.
Dutta et al. (2017) J. Appl. Phys. 122, 025107.
Wolf et al. (2020) Appl. Surf. Sci. 510, 144804.
Scofield (1976) J. Elec Spectroscopy and Rel. Pheno. 8, 129.
Morgan (2015) Surf. Interface Anal. 47, 1072.
Perloff (1977) Solid-State Elec. 20, 681.
Patterson (1939) Phys. Rev. 56, 978.
Jog and Gall (2021) J. Appl. Phys. 130, 115103.
Jog and Gall (2022) IEEE Trans Elec. Dev. 69, 3854.
Milosevic et al. (2018) J. Appl. Phys. 124, 165105.
Milosevic (2019) J. Appl. Phys. 125, 245105.
Cumpson Surf. Interface Anal. 29, 403.
Powell et al. (1967) J. Less. Common Met. 12, 1.
Moretti 1993) Surf. Interface Anal. 20, 681.
Damayanti et al. (2007) Electrochem. and Solid State Lett. 10, p. 15.
Solina et al. (1997) Adv. X-ray Anal. 40.
Tang and Hess (1984) J. Electrochem Sco . . . 131, 115.
T. Aaltonen, A. Rahtu, M. Rital, M. Leskela. Reaction Mechanism Studies on Atomic Layer Deposition of Ruthenium and Platinum. Electrochemical and Solid-State Letters 6(0) C130 (2003).
S. Dutta, K. Sankaran, K. Moors, G. Pourtois, S. Elshocht, J.Bommels, W.Vandervorst, Z. Tokei, C. Adelmann. Thickness Depenence of the Resistiity of Platinum-group Metal Thin Films, Journal of Applied Physics. 122, 025107 (2017).
T. Aaltonen, M. Ritala, K. Arstila, J. Keinonen, M. Leskela. Atomic Layer Deposition of Ruthenium Thin Films from Ru (thd)3 and Oxygen. Chemical Vapor Deposition, 10(4), 215-219 (2004).
D. Gall. The Search for the Most Conductive Metal for Narrow Interconnect Lines. Journal of Applied Physics. 127, 050901 (2020).

D. Kwon, C. An, S. Kim, D. Kim, J. Lim, W. Jeon, C. Hwang. Atomic Layer Deposition of Ru Thin Films Using (2,3-imethyloxopentaienyl) (ethycyclopentadienyl)Ru and the Effect of Ammonia Tratment during the Deposition. Journal of Materials Chemistry C. Issue 21, (2020).
Wolf, et al., Low temperature thermal ALD TaNx and TiNx films from anhydrous N2H4, Applied Surface Science, Dec. 31, 2018, vol. 462, pp. 1029-1035.
Stevens, et al., Area-Selective Atomic Layer Deposition of TiN, TiO2, and HfO2 on Silicon Nitride with inhibition on Amorphous Carbon, Chemistry of Materials, Apr. 27, 2018, vol. 30 issue 10, pp. 3223-3232, DOI: 10.1021/acs.chemmater.8b00017.
Lee, et al., Alternative Surface Reaction Route in the Atomic Layer Deposition of Titanium Nitride Thin Films for Electrode Applications, ACS Applied Electronic Materials, Feb. 5, 2021, vol. 3 issue 2, pp. 999-1005, DOI: 10.1021 /acsaelm.0c01079.
Elam, et al., Surface chemistry and film growth during TiN atomic layer deposition using TDMAT and NH3, Thin Solid Films, Jul. 31, 2003, vol. 436 issue 2, pp. 145-156, DOI:10.1016/S0040-6090(03)00533-9.
Wang, et al., Atomic Vapor Deposition of TiN with Diluted Tetrakis (diethylamido) Titanium (TDEAT) for Phase Change Memory, ECS Transactions, 2009, vol. 22 issue 1, pp. 167-173, DOI:10.1149/1.3152973.
Chen, et al., Plasma-Enhanced Atomic Layer Deposition (PEALD) of TiN using the Organic Precursor Tetrakis(ethylmethylamido) Titanium (TEMAT), MATEC Web of Conferences, Jan. 13, 2016, vol. 39, article No. 01010, DOI: 10.1051/matecconf/20163901010.
Musschoot, et al., Atomic layer deposition of titanium nitride from TDMAT precursor, Microelectronic Engineering, Jan. 2009, vol. 86 issue 1, pp. 72-77, DOI: 10.1016/j.mee.2008.09.036.
Hao, et al., Study on influences of TiN capping layer on time-dependent dielectic breakdown characteristic of ultra-thin EOT high-k metal gate NMOSFET with kMC TDDB simulations, Chinese Physics B, 2016, vol. 25 issue 8, article No. 087305, DOI: 10.1088/1674-1056/25/8/087305.
T. Hong et al. Atomic Layer Deposition of Ru Thin Films Using a Ru(0) Metallorganic Precursor and O2. ECS Journal of Solid State Science and Technology. 2(3) p. 47-p. 53 (2013).
M. H. Hayes, et al. Properties of Annealed ALD Ru from Ru(DMBD)(CO)3 and Oxygen. ECS Meeting Abstracts, vol. MA2018-01 (2018).
D. Kwon et al. Atomic Layer Deposition of Ru Thin Films Using (2,4-dimethyloxopentaienyl) (ethycyclopentadienyl)Ru and the Effect of Ammonia Treatment during the Deposition. Journal of Materials Chemistry C. Issue 21, (2020).
I. Zyulkov et al. Selective Ru ALD as a Catalyst for Sub-Seven-Nanometer Bottom-Up Metal Interconnects. ACS Applied Materials & Interfaces. 9, 31031-31041 (2017).
H. Wang et al. Atomic Layer Deposition of Ruthenium Thin Films from Amidinate Precursor. Chemical Vapor Deposition, 15, 312-319 (2009).
T. Aaltonen et al. Reaction Mechanism Studies on Atomic Layer Deposition of Ruthenium and Platinum. Electrochemical and Solid-State Letters 6(0): C130 (2003).
T. Aaltonen et al. Atomic Layer Deposition of Ruthenium Thin Films from Ru(thd)3 and Oxygen. Chemical Vapor Deposition, 10(4), 215-219 (2004).
S. Cwik et al. Thermal Atomic Layer Deposition of Ruthenium Metal Thin Films using Nonoxidative Coreactants. Journal of Vacuum Science &Technology A38, 012402(2020).
O. Kwon et al. Atomic Layer Deposition of Ruthenium Thin Films for Copper Glue Layer. Journal of Electrochemical Society, 151(2) G109-G112 (2004).
M. Leskela et al. Atomic Layer Deposition Chemistry: Recent Developments and Future Challenges. Angewandte Chemie International Edition, 42 (45). (2003).
Moriarty, John L., Journal of Chemical and Engineering Data 62, p. 422 (1963).

* cited by examiner

METHOD OF FORMING LOW-RESISTIVITY Ru ALD THROUGH A BI-LAYER PROCESS AND RELATED STRUCTURES

CROSS-REFERENCE TO RELATED APPLICATIONS

This application claims the benefit of U.S. Provisional Application Ser. No. 63/286,421, filed Dec. 6, 2021, and U.S. Provisional Application Ser. No. 63/367,017, filed Jun. 24, 2022, the contents of each of which are hereby incorporated herein by reference in their entireties.

STATEMENT OF GOVERNMENT SUPPORT

This invention was made with government funds under Agreement No. HR0011-18-3-0004 awarded by The Defense Advanced Research Projects Agency (DARPA). The U.S. Government has certain rights in this invention.

BACKGROUND

Due to its low bulk resistivity, copper has been used as the interconnect and via metal of choice in VLSI process nodes since the early 2000s (Chen et al. (2000) Thin Solid Films 376, 115; Josell et al. (2009) Ann. Rev. Mater. Res. 39, 231). However, as transistor density continues to increase, via width continues to decrease, and at small dimensions (~<10 nm), the mean free path of electrons in Cu is larger than the layer thickness, resulting in increased electron scattering that contributes to an increase in resistivity (Gall (2016) J. Appl. Phys. 119, 085101). In addition, present Cu interconnects and vias require a thin diffusion barrier layer, typically TiN or TaN which have much higher resistivities than Cu, to prevent migration of Cu into the dielectric layer (Kwak et al. (1999) Thin Solid Films 339, 290; Lane et al. (2011) J. Mater. Res. 15, 203). Due to this barrier layer, a much higher fraction of the via width is taken up by the barrier in narrower vias, further increasing resistance due to the higher resistivity of the barrier (van der Veen et al. (2018) Proc. of the IITC 2018 DOI: 10.1109/IITC.2018.8430407). Ru, with an electron mean free path of 6.6 nm compared with 40 nm for Cu, maintains its bulk resistivity to much narrower via widths due to reduced scattering (Gall (2020) J. Appl. Phys. 127, 050901). In addition, Ru shows higher resistance to electromigration and can potentially be used without a barrier layer, filling the entire via with the lower-resistivity metal and decreasing via resistance (Pedreira et al. (2017) IEEE IRPS 2017 DOI: 10.1109/IRPS.2017.7936340). Due to this high electromigration resistance, as well as its resistance to diffusion into porous low-k dielectrics, its reduction of the effect of thickness on resistivity compared to Cu, and etching by a non-halogen (oxygen), Ru has been proposed for the emerging semidamascene process, in which a blanket metal film is deposited, holes are etched, and the holes are filled with dielectric followed by CMP (Murdoch et al. (2020) IEEE IITC 2020 DOI: 10.1109/IITC47697.2020.9515597).

Ru can be deposited in a variety of methods such as DC sputtering (Lee et al. (2003) Mater. Chem. and Phys. 82, 984.) or chemical vapor deposition (CVD) (Green et al. (1985) J. Elec. Soc. 132, 2677), but special focus is placed on atomic layer deposition (ALD) for interconnect applications due to its thickness controllability and the potential to exploit differences in surface reactivity for area-selective ALD (Khan et al. (2019) Chem. Mater. 30, 7603; Mackus et al. Chem. Mater. (2019) 31, 2). Ru thermal ALD has been reported with a variety of Ru(II) based precursors such as $RuCp_2$ (Aaltonen et al. (Chem. Vap. Depos. (2003) 9, 45) and $Ru(EtCp)_2$ (Kim et al. (2009) J. Korean Phys. Soc. 55, 32), as well as zero-valent Ru compounds like EBECHRu (Popovici et al. Chem. Mater. (2017) 29, 4654). Typically, these reactions are run around 300-360° C. with $O_2$ as a co-reactant, where combustion reactions with the organic ligands leave behind metallic Ru with resistivities roughly 1.5-2× that of bulk Ru. However, many of these processes also result in long nucleation delays which can result in rough films and reduce controllability (Yim et al. (2008) J. Appl. Phys. 103, 113509), in addition to greatly affecting the resistivity of the grown film. Lower-temperature processes with shorter or zero nucleation delay have also been reported using $Ru(DMBD)(CO)_3$+tertiary butyl amine (TBA) and other non-oxidizing co-reactants, but these films result in higher resistivity compared with the high-temperature processes (Gao et al. (2019) Chem. Mater. 31, 1304). $O_2$-free processes using $Ru(DMBD)(CO)_3$ have been performed using TBA or $NH_3$ as co-reactants, but exhibit high resistivities (Gao et al. (2019) Chem. Mater. 31, 1304; Cwik et al. (2020) J. Vac. Sci. A 38, 012402). Resistivity improvements using a post-deposition forming gas anneal (FGA) at 400-500° C. have been reported in the literature, bringing the film resistivity down to a value of 9.1 $\mu\Omega\cdot cm$, compared with the bulk value of ~6.5 $\mu\Omega\cdot cm$. (Hayes et al. (2021) J. Vac. Sci. A 39, 052402). However, the FGA process used to produce these 9.1 $\mu\Omega\cdot cm$ films also induced/resulted in a higher surface roughness following the annealing process.

As such, although Ruthenium (Ru) is attractive as a replacement for Co and Cu in the bottom layers of interconnects, owing to its lower mean-free-path of electrons improving the scaling of resistivity compared with thickness in sub-30 nm thick layers, there remains a need for lower resistivity Ru films and methods of preparing low resistivity Ru films with resistivity values that more closely approach the observed bulk value resistivity of Ru.

SUMMARY

Aspects of the present inventive concept include metal layers/films, such as ruthenium (Ru) layers/films, having resistivities that approach the bulk resistivity of the metal, and methods of preparing/depositing such metal layers/films having resistivities that approach the bulk resistivity of the metal, which have use in, for example, via-fills without the need of a diffusion barrier, and M0/M1 interconnect layers, such as those that may be found in electronic devices and semiconductor devices, such as integrated circuits (ICs) and printed circuit boards (PCBs).

According to an aspect of the inventive concept, provided is an ALD method of depositing a layer on a substrate including exposing the substrate to at least one cycle of: a metal-organic precursor; and a co-reactant, to provide a metal layer on the substrate with a resistivity approaching, near, or about the bulk resistivity of the metal. In some aspects, the metal is ruthenium (Ru). In some aspects, the resistivity is in a range of about 5.8 to about 9.0 $\mu\Omega\cdot cm$. In some aspects, the resistivity is in a range of about 5.8 to about 8.6 $\mu\Omega\cdot cm$.

According to another aspect of the inventive concept, provided is an ALD method including: exposing the substrate to at least one cycle of: a first metal-organic precursor; and a first co-reactant, to provide a seed layer on the substrate, followed by exposing the seed layer to at least one cycle of: a second metal-organic precursor; and a second co-reactant, to provide a metal layer on the substrate with a resistivity approaching, near, or about the bulk resistivity of the metal. In some aspects, the metal is ruthenium (Ru). In some aspects, the resistivity is in a range of about 5.8 to about 9.0 µΩ·cm. In some aspects, the resistivity is in a range of about 5.8 to about 8.6 µΩ·cm.

According to yet another aspect of the inventive concept, provided is an ALD method including: at least one cycle of exposing the substrate to: a $Ru(DMBD)(CO)_3$ metal-organic precursor; and a TBA co-reactant, to provide a seed layer on the substrate, followed by at least one cycle of exposing the seed layer to: an $Ru(CpEt)_2$ metal-organic precursor; and an $O_2$ co-reactant, to provide an Ru layer on the substrate, followed by: annealing the Ru layer with an FGA to provide the Ru layer with a resistivity near the bulk resistivity of the metal. In some aspects, the metal is ruthenium (Ru). In some aspects, the resistivity is in a range of about 5.8 to about 9.0 µΩ·cm. In some aspects, the resistivity is in a range of about 5.8 to about 8.6 µΩ·cm.

Further aspects of the inventive concept include layers/films prepared by the methods of the inventive concept described herein, and devices, such as electronic devices and semiconductor devices, e.g., ICs and PCBs including, for example, vias and/or interconnects including layers/films prepared by the methods of the inventive concept described herein.

DETAILED DESCRIPTION

Figure 1:
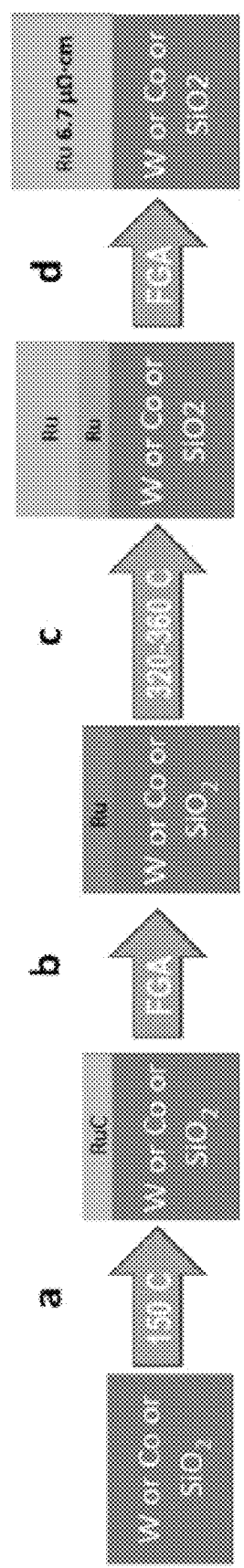
FIG. 1: Flow chart for a Ru ALD process for preparing Ru films with near-bulk resistivity. a) Deposition of Ru via low temperature (about 150-200° C.) process with Ru(DMBD)(CO)$_3$+TBA for up to about 2-4 nm, leaving Ru layer with high-C content. b) Ex-situ FGA of low-temperature deposited Ru film to densify film and reduce C content. c) Deposition of Ru via $O_2$-based process with Ru(EtCp)$_2$ precursor at about 300-360° C. leaving cleaner Ru on the FGA-treated high-C Ru layer. d) Post-deposition forming gas anneal at about 500° C. to provide a low-resistivity Ru film.

The foregoing and other aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the inventive concept. As used in the description of the invention and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/". The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (for example, "such as") provided with respect to certain embodiments herein is intended merely to better illuminate the application and does not pose a limitation on the scope of the application otherwise claimed.

The abbreviation, "e.g." is derived from the Latin exempli gratia, and is used herein to indicate a non-limiting example. Thus, the abbreviation "e.g." is synonymous with the term "for example." No language in the specification should be construed as indicating any non-claimed element essential to the practice of the application.

The term "comprise," as used herein, in addition to its regular meaning, may also include, and, in some embodiments, may specifically refer to the expressions "consist essentially of" and/or "consist of." Thus, the expression "comprise" can also refer to, in some embodiments, the specifically listed elements of that which is claimed and does not include further elements, as well as embodiments in which the specifically listed elements of that which is claimed may and/or does encompass further elements, or embodiments in which the specifically listed elements of that which is claimed may encompass further elements that do not materially affect the basic and novel characteristic(s) of that which is claimed. For example, that which is claimed, such as a composition, formulation, method, system, etc. "comprising" listed elements also encompasses, for example, a composition, formulation, method, kit, etc. "consisting of," i.e., wherein that which is claimed does not include further elements, and a composition, formulation, method, kit, etc. "consisting essentially of," i.e., wherein that which is claimed may include further elements that do not materially affect the basic and novel characteristic(s) of that which is claimed.

The term "about" generally refers to a range of numeric values that one of skill in the art would consider equivalent to the recited numeric value or having the same function or result. For example, "about" may refer to a range that is within ±1%, ±2%, ±5%, ±7%, ±10%, ±15%, or even ±20% of the indicated value, depending upon the numeric values that one of skill in the art would consider equivalent to the recited numeric value or having the same function or result. Furthermore, in some embodiments, a numeric value modified by the term "about" may also include a numeric value that is "exactly" the recited numeric value. In addition, any numeric value presented without modification will be appreciated to include numeric values "about" the recited numeric value, as well as include "exactly" the recited numeric value. Similarly, the term "substantially" means largely, but not wholly, the same form, manner or degree and the particular element will have a range of configurations as a person of ordinary skill in the art would consider as having the same function or result. When a particular element is expressed as an approximation by use of the term "substantially," it will be understood that the particular element forms another embodiment.

The term "substrate," as used herein, can broadly refer to any layer and/or surface upon which processing is desired. Thus, for example, a native oxide film on the surface of a silicon substrate may itself be considered a substrate for the purposes of this discussion. Likewise, layers deposited on silicon or on other base substrates may likewise be considered substrates in some embodiments. For example, in some embodiments, a multi-layer stack may be formed, and then atomic layer deposition and/or atomic layer annealing may be performed on the top layer, or a surface of the top layer, of the stack. In such a case, the top layer may be considered the substrate. In general, the layer or layers upon which the chemical precursor is deposited and/or which reacts with the chemical precursor can be considered the substrate layer(s). The material for the substrate may be any that may be appreciated by one of skill in the art in the field of electronics and/or semiconductors.

Unless otherwise defined, technical and scientific terms used in connection with the present application shall have the meanings that are commonly understood by those of ordinary skill in the art to which this disclosure belongs.

The term "atomic layer deposition" (ALD), as used herein, can broadly refer to the level of layer dimensional control that can be achieved at the angstrom (Å) or sub-angstrom level. Thus, deposition of or growth of a layer and/or film through atomic layer deposition may generally correspond to the size of atoms and/or molecules.

The average added layer thickness per cycle of ALD can be less than 1 Å (0.1 nm) per deposition cycle, for example, about 0.5 Å, about 0.6 Å, about 0.7 Å, about 0.8 Å, about 0.9 Å, about 1 Å, or more than 1 Å, for example, about 1.1 Å, about 1.2 Å, about 1.3 Å, about 1.4 Å, about 1.5 Å, about 2 Å, about 2.5 Å, about 3 Å, about 4 Å, about 5 Å, about 6 Å, about 7 Å, about 8 Å, about 9 Å, about 10 Å (1 nm), or any number between about 0.1-30 Å per deposition cycle. In some embodiments, the average added layer thickness per cycle is between about 0.1-4 Å, about 0.5-4 Å per deposition cycle, about 0.6-4 Å, about 0.7-4 Å per deposition cycle, about 0.8-4 Å per deposition cycle, about 0.9-4 Å per deposition cycle, or about 1-4 Å per deposition cycle.

Similarly, the number of deposition cycles in the ALD process is not particularly limited, and may be any number of cycles that would be appreciated by one of skill in the art. For example, the number of deposition cycles in the process may be between 1 and about 1,000 cycles. In some embodiments, the number of deposition cycles may be between about 1-600 cycles, for example, 1 cycle, about 5 cycles, about 10 cycles, about 20 cycles, about 30 cycles, about 40 cycles, about 50 cycles, about 75 cycles, about 100 cycles, about 150 cycles, about 200 cycles, about 250 cycles, about 300 cycles, about 350 cycles, about 400 cycles, about 450 cycles, about 500 cycles, about 550 cycles, or about 600 cycles, or any number of deposition cycles between and including 1 deposition cycle and about 1,000 deposition cycles. According to some embodiments, a deposition cycle may include exposing the substrate to a pulse, or more than one pulse, for example, 2, 3, 4, 5, 6 pulses, etc. of a chemical precursor, and a pulse, or more than one pulse, for example, 2, 3, 4, 5, 6 pulses, etc. of a co-reactant.

The choice of chemical precursor, or precursors, and the choice of co-reactant, or co-reactants, used to prepare/deposit a layer/film, such as an Ru layer/film, according to the present inventive concept is not particularly limited, and may be any suitable chemical precursor that may be appreciated by one of skill in the art that may be used to prepare a particular layer/film, such as an Ru layer/film. Methods of deposition, such as ALD, according to embodiments of the present inventive concept, may include the use of one precursor, two precursors, or more than two precursors per deposition cycle, and may include the use of one co-reactant, two co-reactants, or more than two co-reactants. In some embodiments, the chemical precursor may be n-4-2,3-dimethylbutadiene ruthenium tricarbonyl (Ru(DMBD)(CO)$_3$). In some embodiments, the chemical precursor may be bis-ethylcyclopentadienyl ruthenium (Ru(CpEt)$_2$). In some embodiments, the method of deposition may include an oxygen-free (O$_2$-free) deposition process, i.e., the co-reactant does not contain oxygen (O$_2$) gas. In some embodiments, the method of deposition may include O$_2$ as a co-reactant. For example, in some embodiments, an O$_2$-free deposition process may include Ru(DMBD)(CO)$_3$ as the chemical precursor and tert-butyl amine (TBA) as the co-reactant. In some embodiments, an O$_2$-utilizing deposition process may include Ru(CpEt)$_2$ as the chemical precursor and O$_2$ as the co-reactant.

Moreover, the substrate on which a layer/film may be deposited/grown according to the present inventive concept include, but are not limited to, for example: SiO$_2$; Si, such as HF-cleaned Si; a low-k dielectric, such as SiCOH; copper (Cu); and/or tungsten (W) substrates.

In some embodiments, the preparation/deposition process may include a one-step process, e.g., an ALD process in which at least one cycle of one chemical precursor/co-reactant used in the ALD process. The one-step deposition process may include, for example, at least one cycle of an O$_2$-utilizing deposition process to provide embodiments of the layer/film of the inventive concept.

In some embodiments, the preparation/deposition process may include a multi-step process, e.g., a two-step, or more than two-step ALD process, wherein a seed layer, for example, a seed layer to promote nucleation, is deposited on the substrate with at least one cycle of a first chemical precursor/co-reactant in a first step, followed by deposition on the seed layer with at least one deposition cycle of a second chemical precursor/co-reactant to thicken the layer/film in the ALD process. The seed layer may be prepared using, for example, an O$_2$-free deposition process, such as a low temperature (150-200° C.) O$_2$-free deposition process, and may have a thickness less than about 5 nm, for example, a thickness in a range of about 1 nm to about 5 nm, about 1 nm to about 4 nm, or about 2 nm to about 4 nm, and on which an O$_2$-utilizing deposition process may be applied to thicken the layer/film and to provide embodiments of the layer/film of the inventive concept.

The thickness of a layer/film prepared by methods of the present inventive concept, as will be appreciated by one of skill in the art, will be dependent on the number of deposition cycles performed in the ALD process, and the number of cycles performed may be as many or as few as may be needed to prepare a layer/film of a desired thickness. For example, the layer film deposited may have a thickness of about 0.1 nm, about 0.2 nm, about 0.3 nm, about 0.5 nm, about 0.7 nm, about 1 nm, about 2 nm, about 3 nm, about 4 nm, about 5 nm, about 6 nm, about 7 nm, about 8 nm, about 10 nm, about 12 nm about 15 nm, about 20 nm, about 25 nm, about 30 nm, about 35 nm, about 40 nm, about 45 nm, about 50 nm, about 55 nm, about 60 nm, about 65 nm, about 70 nm, about 75 nm, about 80 nm, about 85 nm, about 90 nm, about, 95 nm, about 100 nm, or any thickness between about 0.1 nm to about 100 nm, any thickness between about 0.3 nm to about 100 nm, any thickness between about 0.3 nm to about 60 nm, any thickness between about 3 nm to about 60 nm, any thickness between about 12 nm to about 60 nm, any thickness between about 12 nm to about 60 nm, any thickness between about 12 nm to about 50 nm, any thickness between about 15 nm to about 50 nm, any thickness between about 15 nm to about 30 nm, any thickness between about 0.3 nm to about 30 nm, any thickness between about 2 to about 30 nm, or any thickness between about 3 nm to about 30 nm, or any thickness not specifically mentioned in any of the ranges noted, for example, about 0.3 nm, about 0.4 nm, about 0.7 nm, about 1.7 nm, about 2 nm, about 3 nm, about 12, nm about 15.4 nm, about 23 nm, about 30 nm, about 52 nm, and the like, without departing from the scope of the inventive concept.

According to some embodiments of the present inventive concept, the method of preparing a layer/film may include an annealing step(s) prior to and/or after a layer/film deposition step. The annealing atmosphere, the annealing temperature, and the annealing time is not particularly limited. In some embodiments, the annealing step may be, for example, an ultra-high vacuum (UHV) anneal, at a temperature of about 300-500° C., for about 20-60 minutes, or may be a forming gas (H$_2$/N$_2$) anneal (FGA), at a temperature of about 300-500° C., for about 20-60 minutes. In some embodiments, the method of preparing a layer/film may include a UHV anneal at, for example, about 350° C. for about 30 minutes prior to staring the layer/film deposition process, or prior to a deposition step, being performed on the substrate. In some embodiments, the method of preparing a layer/film may include, for example, a forming gas (H$_2$/N$_2$) anneal (FGA) step at, for example, about 350° C., about 450° C., or about 500° C., for about 30 minutes after a deposition step of a layer/film on the substrate, after a deposition step of a first layer/film on the substrate and prior to deposition of a second layer/film on the first layer/film, after a deposition of a second layer/film on a first layer/film on a substrate, or after the final deposition step in the process of preparing a layer/film on the substrate. In some embodiments, the method of preparing a layer/film may include, for example, a forming gas (H$_2$/N$_2$) anneal (FGA) step at, for example, about 350° C. or about 450° C. for about 30 minutes prior to deposition of a layer/film on the substrate, or prior to deposition of a second layer/film on a first layer/film on a substrate.

The present inventive concept provides metal layers/films, such as ruthenium (Ru) layers/films, with resistivities that more closely approach the observed bulk resistivity of the deposited metal, and methods of preparing low resistivity layers/films that possess superior characteristics than those layers/films and methods provided by the prior art.

Reported values for the bulk resistivity of Ru have ranged from about 7.1-7.8 μΩ·cm, to values as low as about 5.8 μΩ·cm. It is further appreciated that the bulk resistivity of Ru is anisotropic, with in-plane resistivity having been reported as being about 7.6 μΩ·cm and out-of-plane (hexagonal or Z-axis) resistivity having been reported as being about 5.8 µΩ·cm. Accordingly, layers/films having resistivities in the ranges of about 5.8-9.5 µΩ·cm, about 5.8-9.0 µΩ·cm, about 5.8-8.6 µΩ·cm, about 5.8-8.2 µΩ·cm, about 5.8-7.8 µΩ·cm, about 5.8-7.4 µΩ·cm, about 5.8-7.1 µΩ·cm, about 5.8-6.9 µΩ·cm, about 6.4-6.9 µΩ·cm, about 6.4-6.5 µΩ·cm, about 6.4-9.0 µΩ·cm, about 6.4-8.6 µΩ·cm, about 6.4-8.1 µΩ·cm, about 6.4-7.8 µΩ·cm, or about 7.1-7.8 µΩ·cm may be considered to have resistivities approaching, near, or about the bulk resistivity of Ru, and layers/films having resistivities in the ranges of about 5.8-7.8 µΩ·cm, about 5.8-7.1 µΩ·cm, about 6.4-7.8 µΩ·cm, about 6.4-6.9 µΩ·cm, or about 6.4-6.5 µΩ·cm may be considered to have resistivities near, or about the bulk resistivity of Ru. According to some embodiments of the present inventive concept, the resistivity of the layer/film, i.e., low resistivity layers/films, prepared by methods according to the present inventive concept is less than, or about 10 µΩ·cm, less than, or about 9.9 µΩ·cm, less than, or about 9.8 µΩ·cm, less than, or about 9.7 µΩ·cm, less than, or about 9.6 µΩ·cm, or less than, or about 9.5 µΩ·cm, down to about the bulk resistivity of Ru (~6.4-6.5 µΩ·cm). In some embodiments, the resistivity of the layer/film prepared by the methods of the present inventive concept is less than or about 9.4 µΩ·cm, less than or about 9.3 µΩ·cm, less than or about 9.2 µΩ·cm, less than or about 9.1 µΩ·cm, less than or about 9.0 µΩ·cm, less than or about 8.9 µΩ·cm, less than or about 8.8 µΩ·cm, less than or about 8.7 µΩ·cm, less than or about 8.6 µΩ·cm, less than or about 8.5 µΩ·cm, less than or about 8.4 µΩ·cm, less than or about 8.3 µΩ·cm, less than about or 8.2 µΩ·cm, less than or about 8.1 µΩ·cm, less than or about 8.0 µΩ·cm, less than or about 7.9 µΩ·cm, less than or about 7.8 µΩ·cm, less than or about 7.7 µΩ·cm, less than or about 7.6 µΩ·cm, less than or about 7.5 µΩ·cm, less than or about 7.4 µΩ·cm, less than or about 7.3 µΩ·cm, less than or about 7.2 µΩ·cm, less than or about 7.1 µΩ·cm, less than or about 7.0 µΩ·cm, less than about or 6.9 µΩ·cm, less than or about 6.8 µΩ·cm, less than or about 6.7 µΩ·cm, less than or about 6.6 µΩ·cm, or less than or about 6.5 µΩ·cm, and/or in a range of any thereof, to down to about the bulk resistivity of Ru (e.g., ~6.4-6.5 µΩ·cm), for a layer/film having a thickness of, for example, but not limited to, about 3 nm to about 100 nm, about 3 nm to about 60 nm, about 3 nm to about 30 nm, or about 12 nm to about 60 nm.

In some embodiments of the present inventive concept(s), low-resistivity Ru layers/films and deposition of low-resistivity Ru layers/films by ALD is provided by a single-step ALD process of bis-ethylcyclopentadienyl ruthenium (Ru(CpEt)$_2$)+O$_2$ at ~300-360° C. In some embodiments of the present inventive concept, low-resistivity Ru layer/films and deposition of low-resistivity Ru layers/films by ALD is provided is a two-step ALD process using a low-temperature (~150-200° C.) ALD process using n-4,2,3-dimethylbutadiene ruthenium tricarbonyl (Ru(DMBD)(CO)$_3$)+tert-butyl amine (TBA) to form a seed layer, followed by the higher temperature Ru(CpEt)$_2$+O$_2$ process to encourage large grain sizes during growth. After post-deposition forming gas anneal, the resistivity of these layers/films approaches 7 µΩ·cm down to a thickness of 20 nm, close to the bulk value of 6.5 µΩ·cm and significantly improved over sputtered layers/films of similar thickness.

Some embodiments of the present inventive concept(s) may combine an O$_2$-based process for depositing a Ru layer/film with an O$_2$-free process, wherein the O$_2$-free process deposits a seed layer to promote nucleation, and the O$_2$-based process to thicken the layer/film and to provide a film/layer with near-bulk resistivity. Accordingly, in some embodiments, a seed layer of Ru is deposited with the low-temperature Ru(DMBD)(CO)$_3$+tert-butyl amine (TBA) process, followed by the deposition of low-resistivity Ru with Ru(CpEt)$_2$+O$_2$. In some embodiments according to the inventive concept(s), a FGA is performed to lower resistivity when the Ru layer from Ru(DMBD)(CO)$_3$+TBA is thick, e.g., in a one-step process. However, in some embodiments, the seed layer from a Ru(DMBD)(CO)$_3$+TBA deposition is annealed by FGA prior to deposition of Ru by Ru(CpEt)$_2$ to avoid, e.g., Cu diffusion during Ru O$_2$-based ALD.

In some embodiments, a process flow for preparing low-resistivity Ru layers/films may include: a) deposition via a low temperature (150-200° C.) process with Ru(DMBD)(CO)$_3$+TBA for up to about 2-4 nm, leaving a Ru layer with high-C content; b) deposition of Ru via an O$_2$-based process with Ru(EtCp)$_2$ precursor at about 300-340° C. leaving a cleaner layer of Ru above high-C Ru layer; and c) post-deposition forming gas anneal at about 350-500° C., for example, at about 450° C. or about 500° C., to provide a low-resistivity Ru film. In some embodiments, the process may further include an ex-situ FGA after the low temperature process to densify and reduce C content in the 2-4 nm Ru layer prior to the O$_2$-based deposition, and to produce a metallic Ru film which is a superior diffusion barrier to O$_2$ and to produce a smoother film.

In some embodiments according to the inventive concept(s), a process that can be used to deposit Ru films via ALD non-selectively with resistivity close to that of bulk Ru, for example, as depicted in FIG. 1. The process flow for preparing low-resistivity Ru layers/films may include: a) deposition via a low temperature (150-200° C.) process with Ru(DMBD)(CO)$_3$+TBA for up to about 2-4 nm, to provide a Ru layer with high-C content; b) ex-situ FGA of the low-temperature deposited Ru film to densify the film and reduce C content in the about 2-4 nm layer; c) deposition of Ru via an O$_2$-based process with Ru(EtCp)$_2$ as the precursor at about 300-360° C. to provide a cleaner layer of Ru on the FGA treated high-C Ru layer; and d) post-deposition FGA at about 500° C. to provide a low-resistivity Ru film. The process may also optionally include a UHV anneal, for example, at e.g., about 350° C. for about 30 minutes of the substrate prior performing a).

The present inventive concept is more particularly described in the following examples, which are intended to be illustrative only, since numerous modifications and variations therein will be apparent to those skilled in the art.

EXAMPLES

Ruthenium Atomic Layer Deposition with Near-Bulk Resistivity for Interconnects

1. Experimental Methodology

Figure 2:
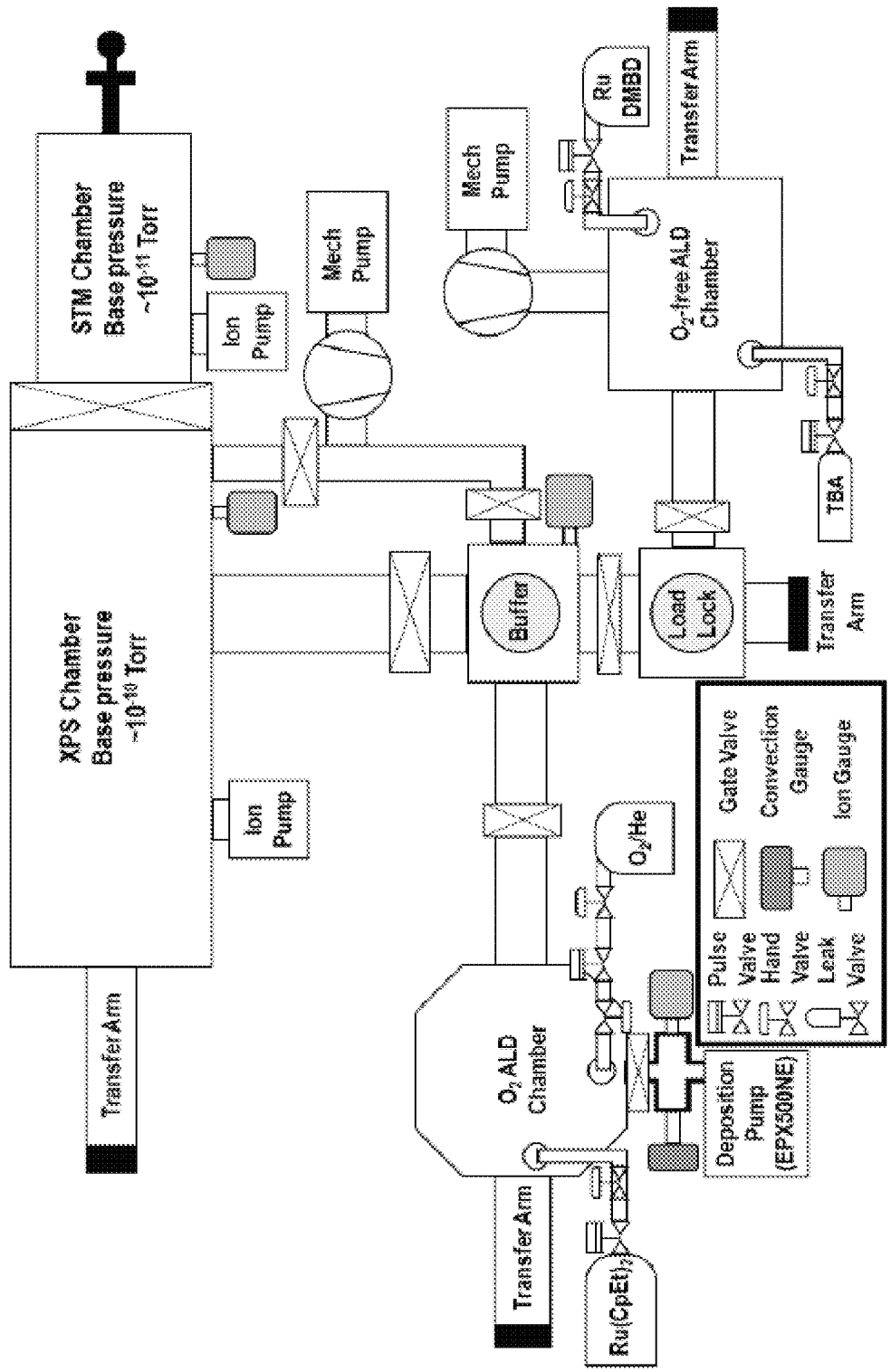
FIG. 2: Chamber Schematic. XPS system with an attached load-lock and ALD chamber allows for in situ chemical composition characterization without exposure to oxygen.

Ru ALD was performed by two processes at high and low temperature. The high temperature process employed Ru(CpEt)$_2$ ("CpEt process," EMD Electronics) with 10% O$_2$ and 90% He carrier gas as a co-reactant. The low-temperature process employed Ru(DMBD)(CO)$_3$ ("DMBD process," EMD Electronics) with tert-butyl amine (TBA) as co-reactant to avoid any substrate oxidation. Both precursors were heated to allow sufficient vapor pressure, with the Ru(CpEt)$_2$ heated to 80° C. and the Ru(DMBD)(CO)$_3$ heated to 50° C. Experiments were carried out in a custom-designed multi-chamber (FIG. 2) consisting of a load-lock chamber, two cold-wall (~120° C.) deposition chambers to the high and low-temperature processes respectively, and a UHV chamber (base pressure ~$10^{-10}$ Torr) containing the x-ray source and hemispherical analyzer used for XPS. 2 mm wide sample coupons were used to facilitate simultaneous deposition on multiple substrates. Prior to deposition, samples were degreased using acetone, methanol, and DI water, then dipped in 0.5% HF solution for 30 seconds, followed by a 30 minute 350° C. UHV anneal at ~$10^{-8}$ Torr to remove adventitious carbon using a pyrolytic boron nitride heater.

The deposition chambers were pumped via turbomolecular pump (Pfeiffer TMP-151C for the low-temperature chamber, base pressure ~$10^{-6}$ Torr; Edwards EPX-500NE for the high-temperature chamber, base pressure ~$10^{-6}$ Torr) to minimize background contamination during deposition. Each chamber contained a manipulator arm compatible with the sample holder for XPS and with an embedded cartridge heater external to the chamber to avoid any potential shorting of heater leads during deposition as well as hot wire CVD. The CpEt process was performed at 330--360° C. deposition temperature at a pressure of ~1 Torr, while the DMBD process was performed at 160-180° C. at a pressure of ~1 Torr. To determine if substrate selectivity was present, several substrates including $SiO_2$, HF-cleaned Si, low-k dielectric (SiCOH), Cu, and W substrates (Applied Materials) were used. After deposition, samples were transferred in-situ to the attached UHV chamber for XPS. A monochromatic XM1000 Mk. II/SPHERA system (Scienta Omicron) was used to collect XPS spectra with an Al kα source at 1486.7 eV at an angle of 60° with respect to the sample surface normal. An analyzer pass energy of 50 eV and linewidth of 0.1 eV were used, and quantification was performed using CASA XPS 2.3 software with raw peak areas corrected using the Scofield relative sensitivity factors and Shirley background subtraction (Scofield (1976) J. Elec Spectroscopy and Rel. Pheno. 8, 129). Due to the overlap of the Cls and Ru 3d3/5 peak positions, quantification of C is complicated by the need to deconvolute the two signals, with the difference in relative sensitivity factors between Ru and C resulting in large uncertainties. Morgan (Morgan (2015) Surf. Interface Anal. 47, 1072) employed an asymmetric peak fit with empirically determined parameters to provide a closer fit for Ru 3d3/5, but the lack of an in-situ ion gun for surface contamination sputtering before XPS prevents the determination of these parameters on a known-pure Ru surface.

After deposition and in-situ analysis, samples were removed and 4-point-probe (Ossila Four-point-probe System, Ossila, Ltd.) measurements were performed on Ru films of 6 mm×2 mm with a probe spacing of 1.27 mm, corresponding to a geometric sheet resistance correction factor of 0.34 to account for the narrow sample dimensions (Perloff (1977) Solid-State Elec. 20, 681). Resistivity measurements were also independently performed using a Jandel linear four-point probe with 1 mm inter-probe spacings and a corresponding geometric correction factor of 0.4297 to convert the obtained resistance values to sheet resistance. XRD measurements were performed on the films to determine grain orientation and size using the Scherrer approximation (Patterson (1939) Phys. Rev. 56, 978; Jog and Gall (2021) J. Appl. Phys. 130, 115103); Jog and Gall (2022) IEEE Trans Elec. Dev. 69, 3854). X-ray reflectivity (XRR) analyses were performed using a PANalytical X'pert PRO MPD system with a Cu source and a parabolic mirror yielding a parallel beam with a <0.055° divergence. ω-2θ scans were performed at shallow angles, 0.2-5.0° and the resulting data comprising of thickness oscillations was fit to the Parratt formalism for reflectivity using the PANalytical X'pert Reflectivity software. The fitting yields the layer thickness and density (Milosevic et al. (2018) J. Appl. Phys. 124, 165105; Milosevic (2019) J. Appl. Phys. 125, 245105). Hayes et. al. showed that a post-deposition forming gas anneal (FGA) can be used to further improve the resistivity of the film (Hayes et al. (2021) J. Vac. Sci. Technol. 39, 052402), so these measurements were repeated for samples after a 30 minute 450° C. FGA, and SEM and AFM were used to inspect the morphology of the surface. Finally, TEM of the deposited Ru films on $SiO_2$, W, and Cu was performed to obtain cross-sectional chemical profiles by energy-dispersive spectroscopy (EDS).

2. Results and Discussion

A deposition process was first performed using the cyclopentadienyl-based Ru precursor, $Ru(CpEt)_2$ with $O_2$ as a co-reactant. $SiO_2$, Si, and low-k dielectric were first loaded and annealed in UHV as described above, followed by 100 cycles of Ru ALD by alternating pulses of $Ru(CpEt)_2$ and $O_2$. The maximum pressure in the chamber was limited to maintain high pumping speed and protect the turbomolecular pump; this was accomplished by using multiple doses during each half-cycle, with chamber pressure during dosing rising to around 10 mTorr for $Ru(CpEt)_2$ and ~1 Torr $O_2$/He ($O_2$ partial pressure ~100 mTorr). Deposition was carried out at 330° C. with pump-out times between half-cycles of 50 seconds for $Ru(CpEt)_2$ and 30 seconds for $O_2$ to give enough time for precursor to desorb from the walls after dosing, avoiding any potential gas-phase reactions leading to CVD-like growth.

Figure 3:
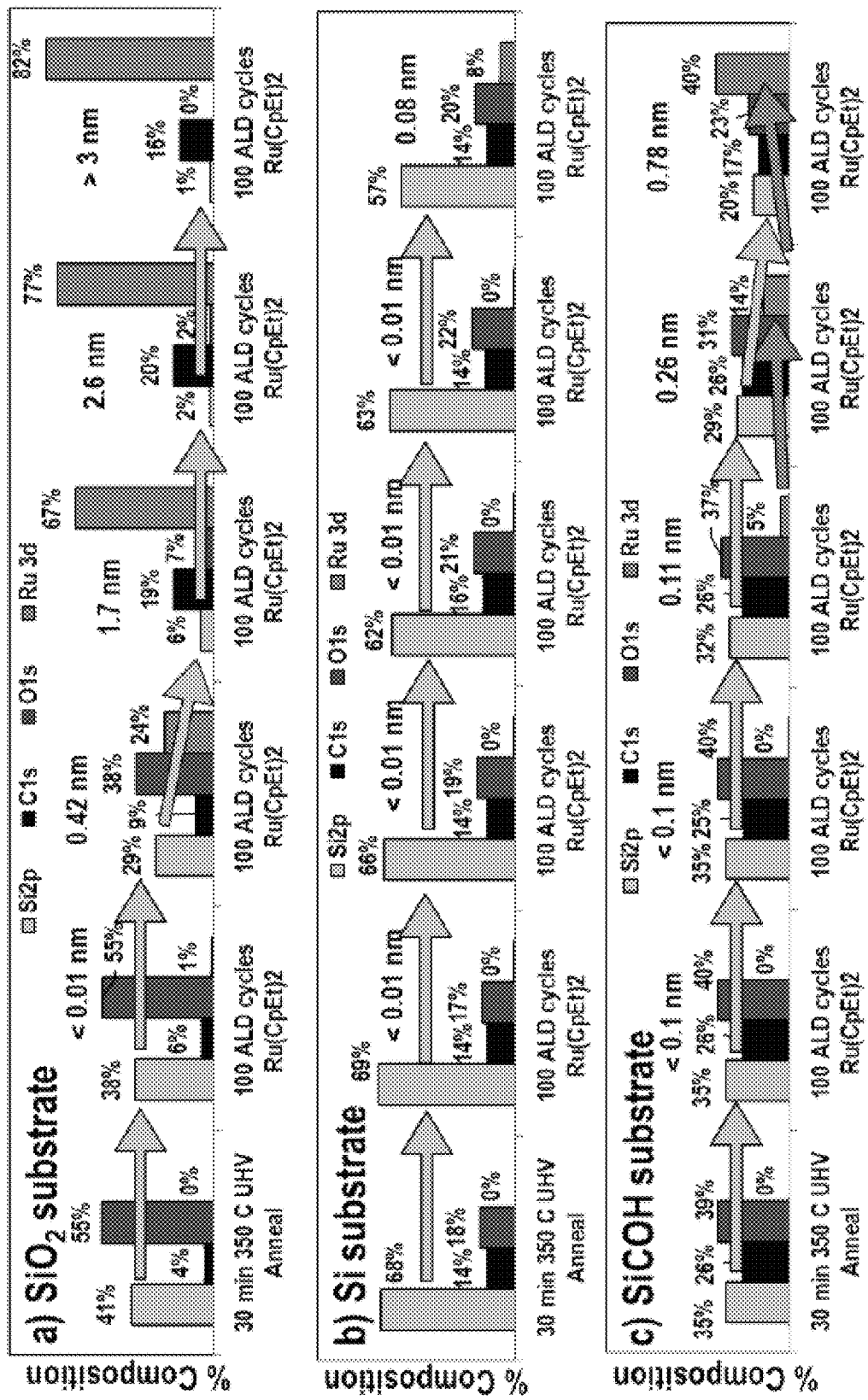
FIG. 3: XPS of Ru ALD nucleation at 330° C. with Ru(CpEt)$_2$+O$_2$ on SiO$_2$, Si, and SiCOH. On all three substrates, a significant nucleation delay was observed. Panel a) On the SiO$_2$ substrate, a nucleation delay of ~200 cycles was observed. Panel b) On Si substrate, growth was inhibited for the first 500 cycles, with sub-monolayer coverage persisting even after 500 cycles of deposition. Panel c) On low-k dielectric, a nucleation delay of ~300 cycles was observed.

FIG. 3 illustrates a step-by-step comparison of the surface elemental composition as measured by XPS. Increments of 100 ALD cycles were performed, with significant nucleation delay occurring on all three samples. Previous depositions with the $Ru(CpEt)_2$ precursor have noted a high nucleation delay, typical of other high-temperature $O_2$-based processes (Kim et al. (2009) J. Korean Phys. Soc. 55, 32). Comparison of the substrates showed that this nucleation delay was significantly longer on the Si substrate than on $SiO_2$ or the low-k dielectric. On $SiO_2$ after 300 ALD cycles, the Si XPS signal decreased to 6%; using the Thickogram method of thickness estimation (Cumpson Surf. Interface Anal. 29, 403), assuming a uniformly thick film, this corresponded to a Ru layer 1.7 nm thick. After 500 total cycles on $SiO_2$, the substrate signal is sub-1%, implying a film thicker than 3 nm.

On HF-cleaned Si, nucleation was still poor after 500 cycles, with sub-monolayer coverage persisting even after 500 cycles. On the low-k dielectric, an intermediate nucleation delay was observed, with a near-monolayer (~0.3 nm) coverage after 400 cycles. Yim et. al. proposed that nucleation of Ru is enhanced by the presence of reactive hydroxyl groups on the surface, and these results were consistent with only a trace amount of hydroxyl groups on the low-k SiCOH substrate as well as an even lower density of hydroxyl groups on HF-cleaned Si. (Yim et al. 2008) J. Appl. Phys. 103, 113509).

Figure 4:
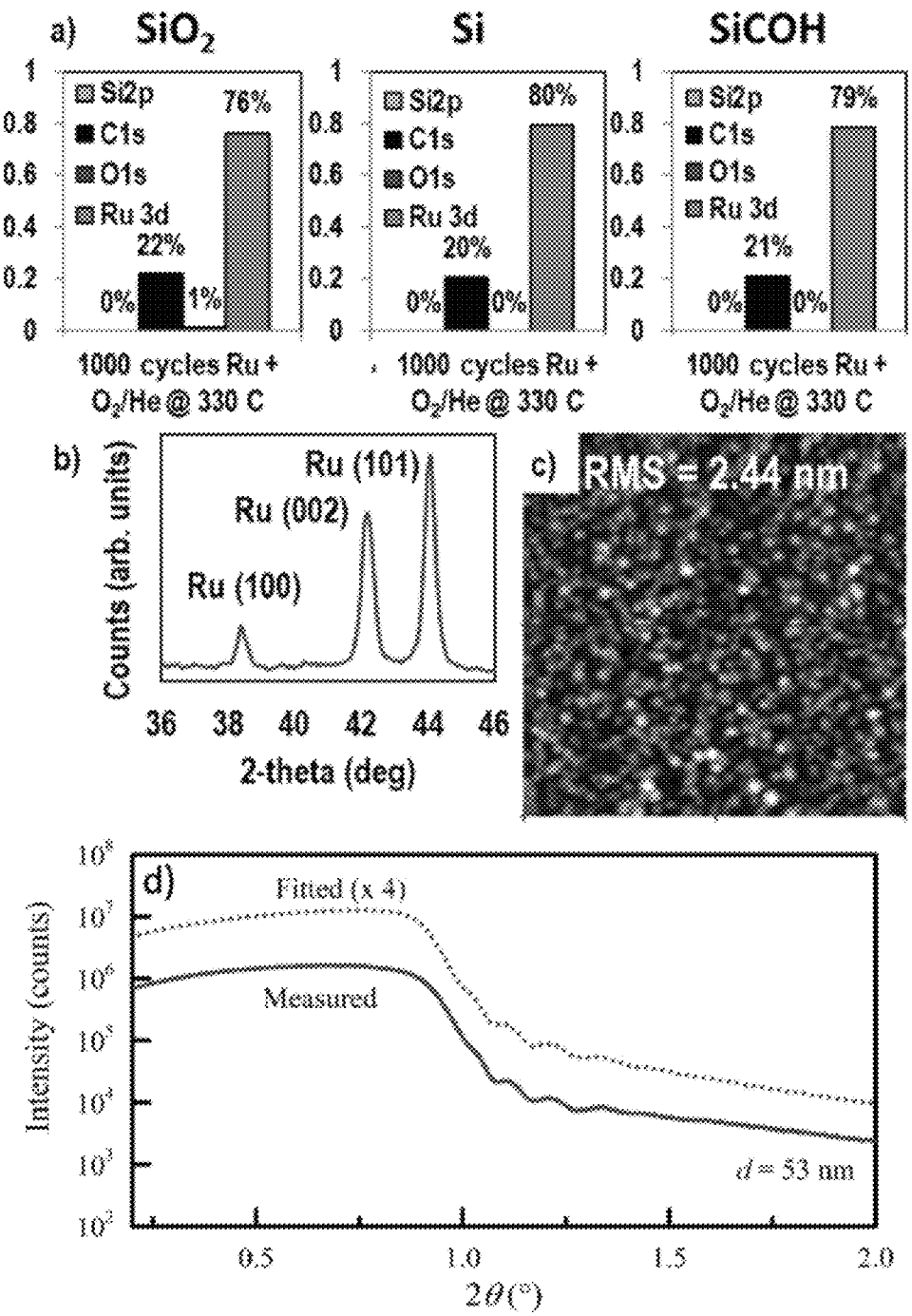
FIG. 4: XPS/XRD/AFM of Ru ALD after 1000 cycles at 330° C. with Ru(CpEt)$_2$+O$_2$ on SiO$_2$, Si, and SiCOH. a) After 1000 cycles, all three substrates are fully covered by the Ru film, with oxygen levels below the noise floor. b) XRD shows relative intensities of the (002) and (101) peaks are similar. c) AFM over a 2×2 µm region shows a film RMS roughness of ~2.4 nm. d) Measured XRR intensity and curve fit, indicating a layer thickness d=53 nm.
Figure 5:
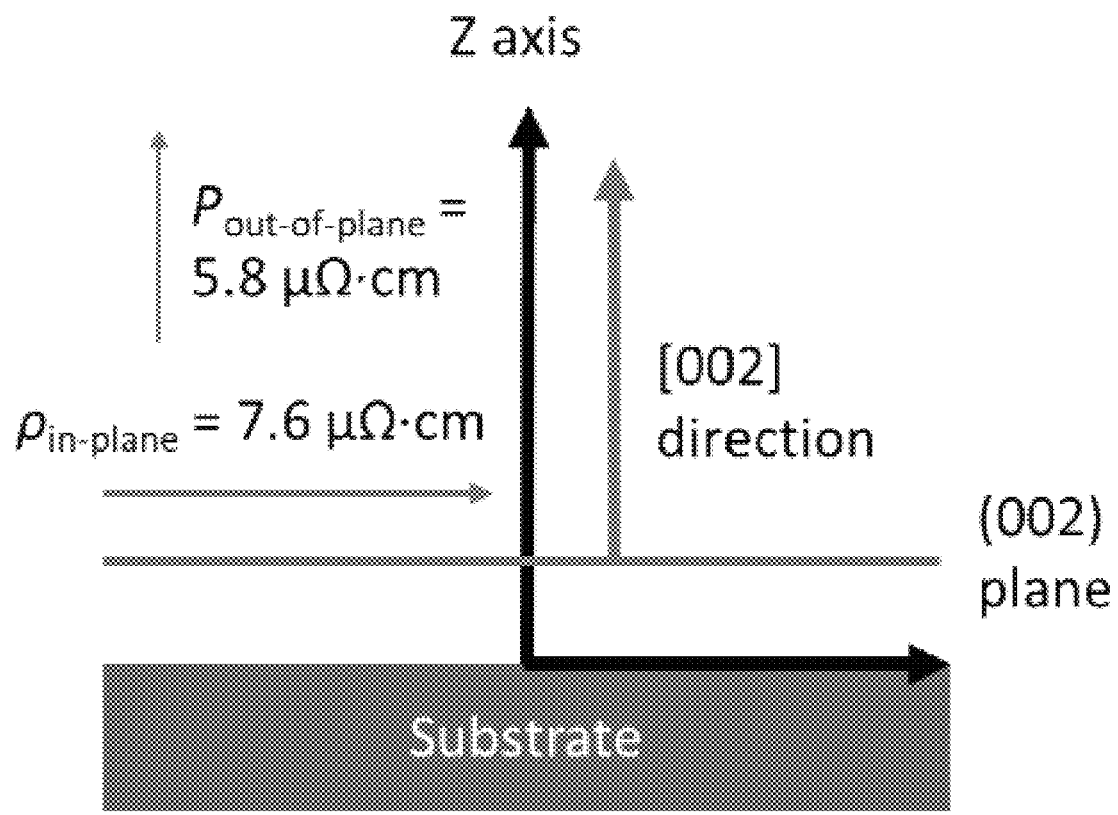
FIG. 5: Direction-dependent resistivity of Ru. The bulk resistivity of Ru has been shown to be anisotropic, with a bulk resistivity of 7.6 µΩ·cm in the basal plane orientation [29], and a resistivity of 5.8 µΩ·cm in the Z axis of the hexagonal structure.

After the nucleation analysis, an additional 500 cycles of Ru were deposited to provide a film thick enough for a bulk resistivity measurement. FIG. 4a) shows the XPS quantification of the resulting 1000 cycle process on $SiO_2$, Si, and low-k dielectric. All three substrates were fully attenuated in XPS, consistent with a continuous Ru film >5 nm thick, with oxygen levels remaining around the noise floor (<1%). After deposition, four-point-probe measurements resulted in a sheet resistance of 1.2Ω/□ on $SiO_2$, corresponding to a resistivity of 6.5±0.4 μΩ·cm. The latter is obtained using a thickness of 53±3 nm, determined from XRR measurements shown in FIG. 4d). The XRR fitting also provides a value for the surface roughness of 3.6±0.5 nm, in reasonable agreement with the AFM analysis presented below. FIG. 4b) shows the XRD pattern of the Ru film deposited on $SiO_2$ with distinct Ru (100), (002), and (101) peaks, consistent with the formation of a polycrystalline film, with grain sizes of roughly 27 nm for the (002) orientation. Typical reported values for the bulk resistivity of Ru vary, and these values range from ~7.1-7.8 μΩ·cm, to as low as 5.8 μΩ·cm for electron transport in the hexagonal (Z) axis (see, FIG. 5) (Milosevic et al. (2018) J. Appl. Phys. 124, 165105; Powell et al. (1967) J. Less. Common Met. 12, 1). As the (002) plane is perpendicular to the hexagonal axis, this is consistent with the observed resistivity value. This has the potential to be useful for the emerging semi-damascene process as the lowest resistivity transport direction is the vertical direction of the via (Murdoch et al. (2020) IEEE IITC 2020 DOI: 10.1109/IITC47697.2020.9515597). FIG. 4c) shows an AFM image over a 2×2 μm region on the $SiO_2$ film showing a root-mean-square roughness of 2.4 nm which is small compared to the thickness of the film.

Figure 6:
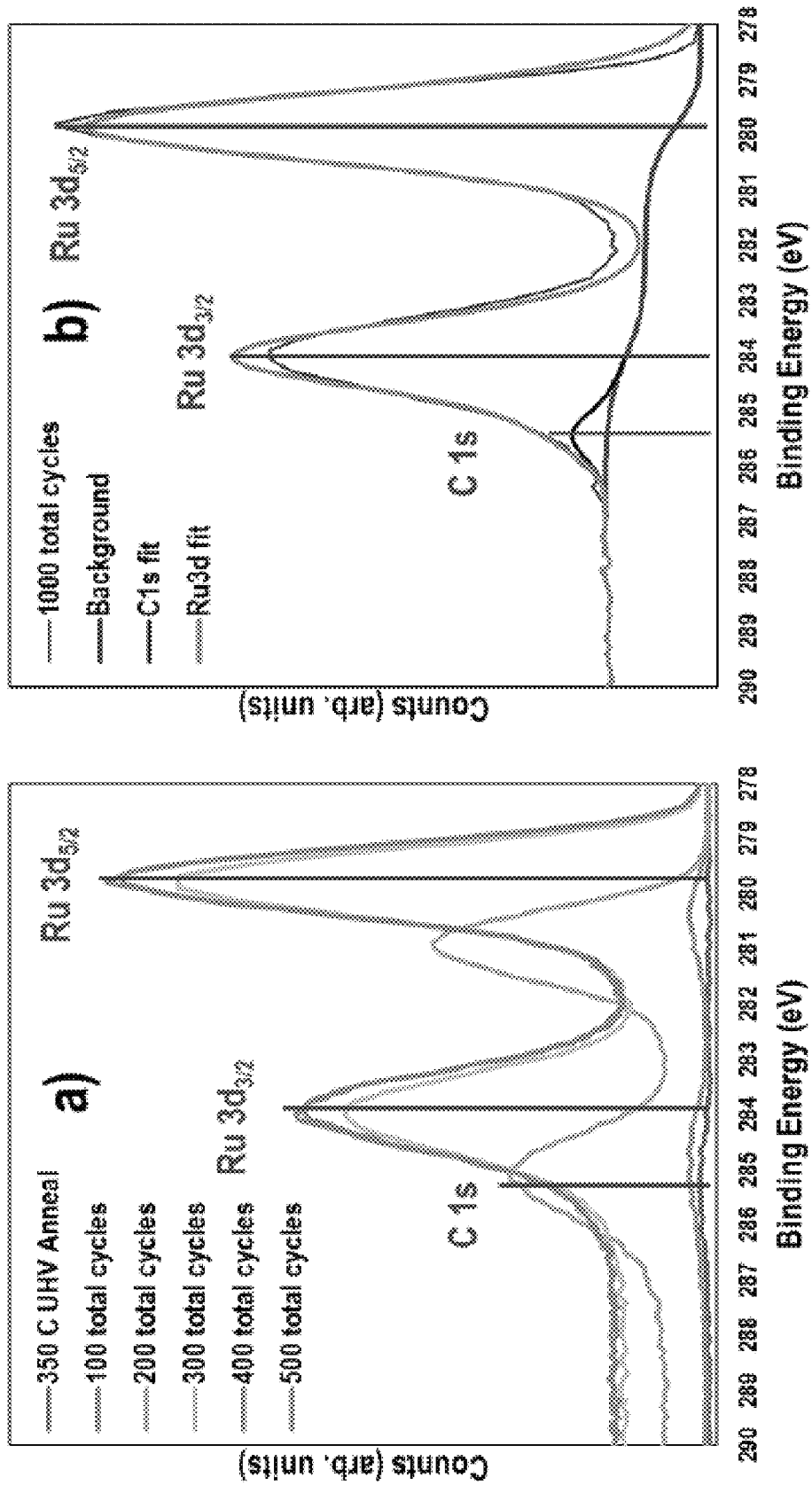
FIG. 6: High-resolution XPS of Ru ALD nucleation at 330° C. with Ru(CpEt)$_2$+O$_2$ on SiO$_2$. After the first hundred cycles, Ru 3d peaks begin to appear, with the shoulder of the higher energy spin-orbit split overlapping C1s. With the addition of an additional 100 cycles, the Ru 3d5/2 peak shifts to 280.9 eV, consistent with RuOx formation, but after a total of 300 cycles, the location of the Ru 3d5/2 peak returns to 279.8 eV and remains after additional cycles, consistent with metallic Ru. b) The peak fitting after 1000 cycles is shown, with the C shoulder centered at 285.7 eV. Note that due to the difference in relative sensitivity factors between Ru 3d and C Is, the C peak represents 20% composition.

After the full 1000 cycles, a C content of 20-22% was observed on all three substrates; note this is just surface carbon from residual ligands not bulk carbon. FIG. 6 shows the high-resolution scan of the binding energies corresponding to Ru 3d for Ru and C is for C during the saturation analysis and after 1000 cycles. FIG. 6 shows the XPS spectra for the first 500 cycles on $SiO_2$. After the initial UHV anneal, a small peak at 285.3 eV corresponding to adventitious C remaining after anneal was present. Depositing 100 cycles of the $Ru(CpEt)_2+O_2$ process at 330° C., a split-peak corresponding to Ru 3d appeared, with the 3d5/2 spin orbit split centered at 280.5 eV. With an additional 100 cycles, the Ru 3d peak further shifted to 280.9 eV, corresponding to the reported value for $RuO_2$ (Morgan (2015) Surf. Interface Anal. 20, 681). After 300 total cycles, the peak shifted back to 279.8 eV, the value reported for metallic Ru, and remained at 279.8 eV after 1000 total cycles deposited. As mentioned above, precise C quantification with Ru present was complicated by the direct overlap between the C1s and Ru 3d3/2 peaks, with the Ru peak having a significantly higher relative sensitivity factor. Small changes in the measured C is fit on the high-energy shoulder of the Ru 3d3/2 peak can significantly change the calculated amount of carbon. Therefore, cross section TEM-EDX is used below to better quantify the carbon in the Ru film.

Figure 7:
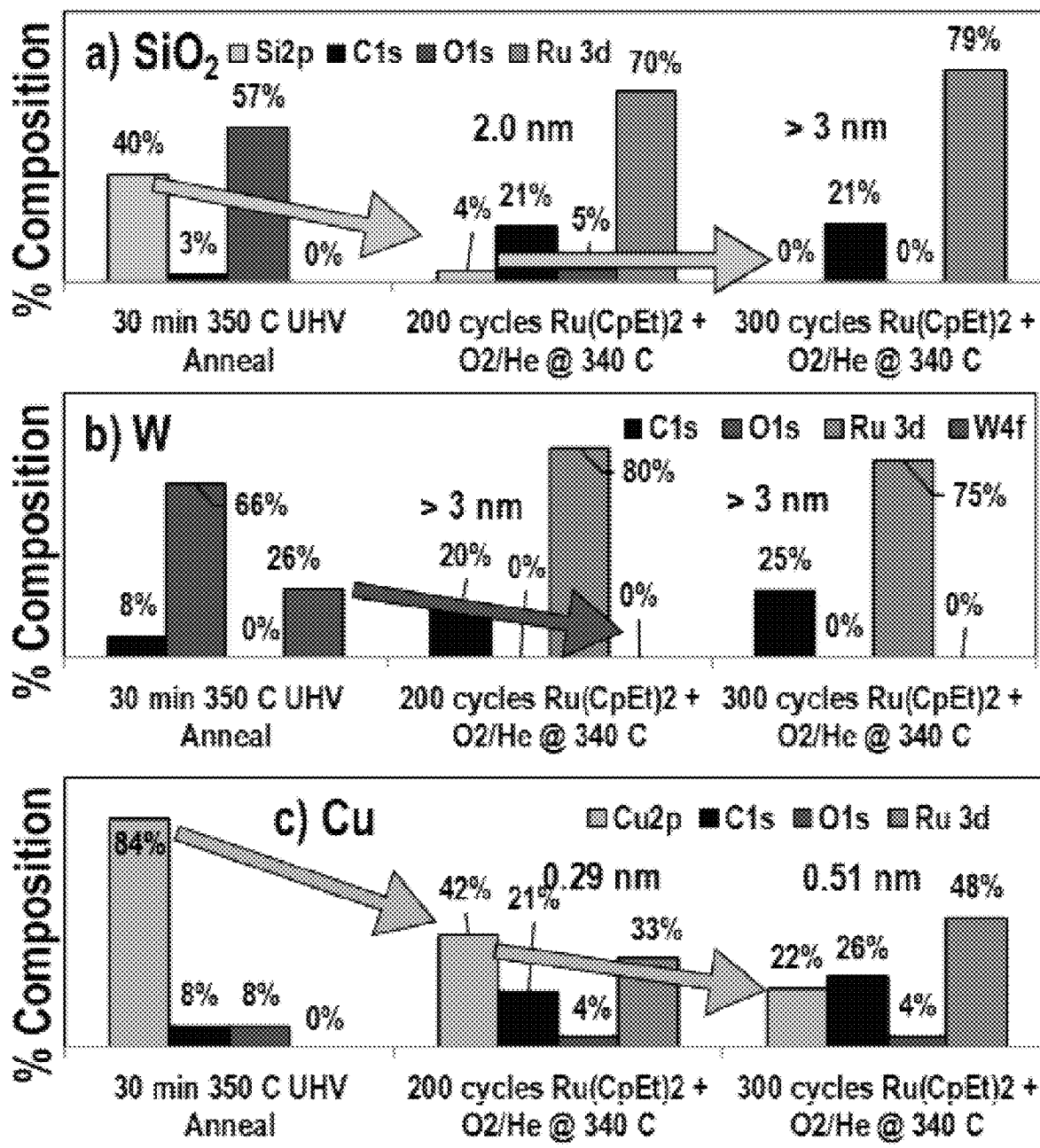
FIG. 7: XPS of Ru ALD at 340° C. with Ru(CpEt)$_2$+O$_2$ on SiO$_2$, W, and Cu. a) Substrate near-fully attenuated after first 200 cycles, and fully attenuated after 500 total cycles. b) Substrate is fully attenuated after first 200 cycles. c) Substrate remains visible in XPS even after 500 cycles.

As the intended purpose of Ru metallization is to serve as a low resistance via between interconnect layers, compatibility with other used metals is key. FIG. 7 demonstrates the deposition of the low-resistance Ru film using the CpEt process on $SiO_2$, Cu, and W substrates. After the first 200 cycles of Ru ALD at 340° C., the W substrate was fully attenuated, compared with a 4% Si signal consistent with a ~2 nm film thickness on $SiO_2$. However, on the Cu substrate, growth appeared to be significantly slower, with an estimated 0.3 nm film thickness using the Thickogram method (Cumpson (2000) Surf Interface Anal. 29, 403). An additional 300 cycles deposited resulted in complete coverage on both $SiO_2$ and W, but significant Cu signal remains, with an estimated thickness of 0.5 nm assuming a uniform thin film.

After deposition, the Ru film thickness on $SiO_2$ was measured by XRR to be 30 nm with a sheet resistance of 2.7Ω/□, for a resistivity of 8.1 μΩ·cm, slightly higher than the bulk value of Ru.

Figure 8:
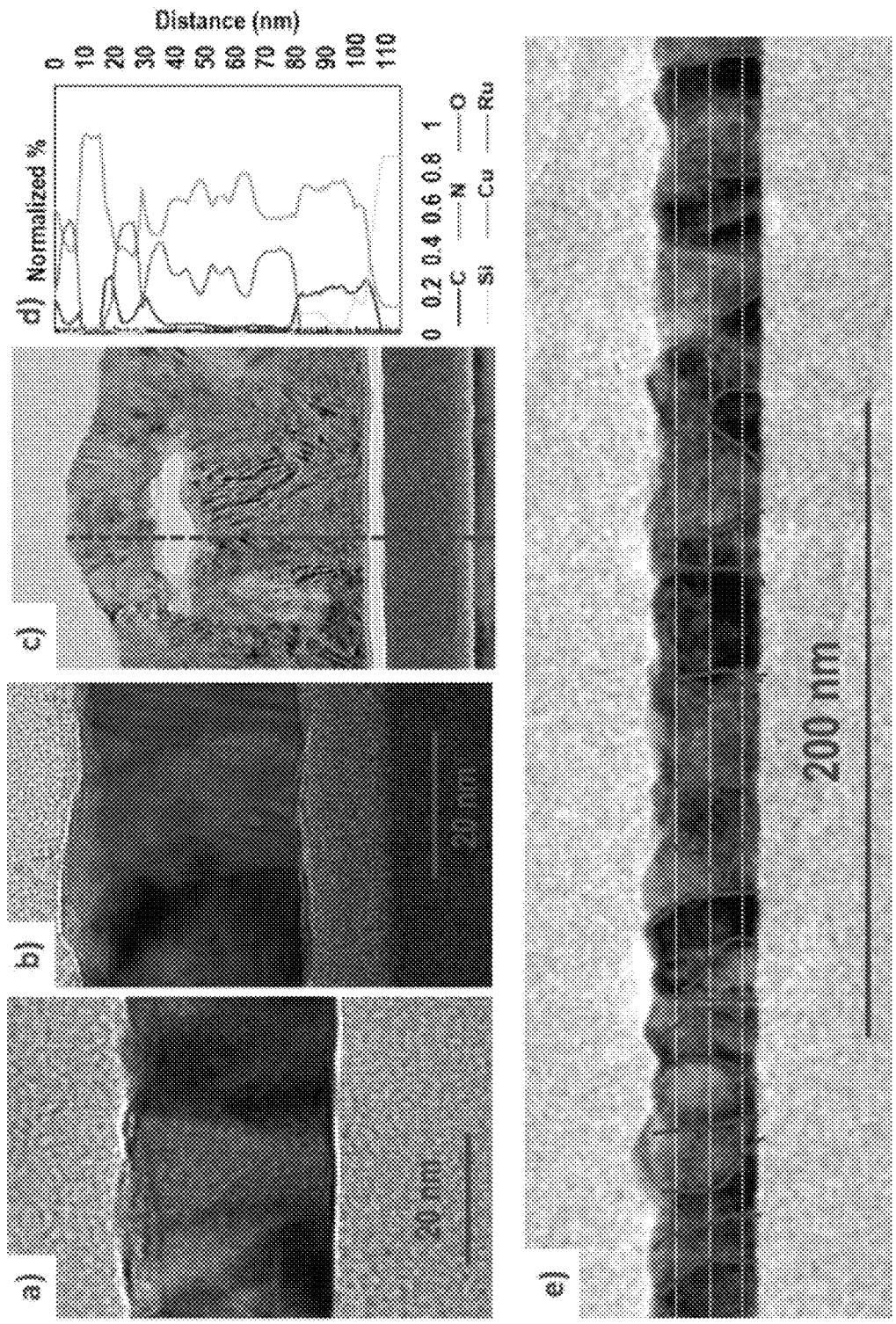
FIG. 8: TEM of Ru ALD at 340° C. with Ru(CpEt)$_2$+O$_2$ on SiO$_2$, W, and Cu. a) SiO$_2$ TEM. b) W TEM. c) Cu TEM and d) Cu EDS showing significant void formation and delamination from the underlying Cu surface along with Ru intermixing. e) Outline of grains across 400 nm length of Ru film deposited on SiO$_2$, showing mostly vertically-oriented grains.

Next, a TEM cross-section of each of the samples deposited above was performed. In FIG. 8a) a Ru film with columnar grains was observed on the $SiO_2$ substrate. By EDS, the average C content in the Ru film was estimated at 19%. Previous studies of Ru—C films showed a film resistivity of 110 μΩ·cm with a similar C concentration; as the Ru film deposited on $SiO_2$ had a resistivity near the bulk level, this C content is likely to be overestimated (Chen et al. (2010) 157, G997). XRD performed on the Ru film deposited on the $SiO_2$ substrate showed an average crystallite size of 23 nm for the (002) orientation and 20 nm for the (101) orientation using the Scherrer approximation for crystallite size.

To estimate the degree to which grains are arranged vertically, a 400 nm long section of the film by TEM was visually inspected to count the number of grains, as well as their average lateral grain size (FIG. 8e). To estimate the degree to which the columnar grains are continuous to the top of the film, a count of grain boundaries was done at 5 nm, 15 nm, and 25 nm from the Ru/$SiO_2$ interface, showing a count of 23, 21, and 19 boundaries respectively. As the number of grain boundaries remains similar throughout the depth of the film, columnar grains are observed. Damayanti et. al. demonstrated the deposition of Ru films by DC sputtering at room temperature having columnar grains of around 5 nm width. After post-deposition annealing at 350° C. for 30 minutes, these grains increase in size to 10-15 nm (Damayanti et al. (2007) Electrochem. and Solid State Lett. 10, P15). Comparison of this result with the ALD-deposited Ru films in this work, the grain sizes during ALD are around 2× larger. As the anneal of the DC sputtered Ru films was carried out for 30 minutes compared with the multiple-hour-long high-temperature ALD processes, this result is consistent with the increased length of time at temperature during ALD encouraging larger grain growth. Estimation of the TEM grain sizes of the ALD Ru film showed an average grain size of 19 nm, compared with the 23 nm estimate by XRD for the (002) oriented grains. As this is smaller than the mean grain size determined by the Scherrer approximation with XRD, the discrepancy may be due to the lamella thickness including multiple grains, complicating the identification of grains by visual inspection.

TEM of the Ru film deposited on W shown in FIG. 8b) was similar in morphology to the film deposited on $SiO_2$, with a lighter layer visible below the Ru film. XPS of the pre-deposition substrate shows significant O content, implying this layer consists of $WO_x$ (x=2.5-3) native oxide instead of metallic W (Solina et al. (1997) Adv. X-ray Anal. 40). W native oxide is known to be etched by $SF_6$ or $CF_4$ plasma etchants; as no in-situ plasma etch was available, the pre-deposition HF clean was insufficient to remove the native oxide (Tang and Hess (1984) Solid State Sci. and Tech. 131, 115). TEM of the Ru film deposited on Cu (FIG. 8c), however, showed significant intermixing of the Cu into Ru by TEM-EDS cross-section (FIG. 8d), as well as delamination from the Cu surface and void formation towards the top of the film. One reason for this may be that the $O_2$-based process formed an oxide on the Cu surface before Ru nucleation has completely covered the substrate, inhibiting growth and resulting in poor film adhesion.

To test this, a 4 nm thick seed layer of Ru was first deposited on $SiO_2$ and Cu surfaces by DC sputtering (Denton Vacuum) at 100 W, 2 mTorr, and 25° C. substrate temperature, followed by 300 cycles of Ru ALD at 360° C. with the $Ru(CpEt)_2+O_2$ process. (see diagrams of structures in FIGS. 7a and 7b). Both substrates were Si (100) with a 300 nm thermal $SiO_2$ layer, with the Ru PVD seed layer on the PVD Cu surface deposited by DC sputtering at 200 W, 2.5 mTorr, and 25° C. substrate temperature.

Figure 9:
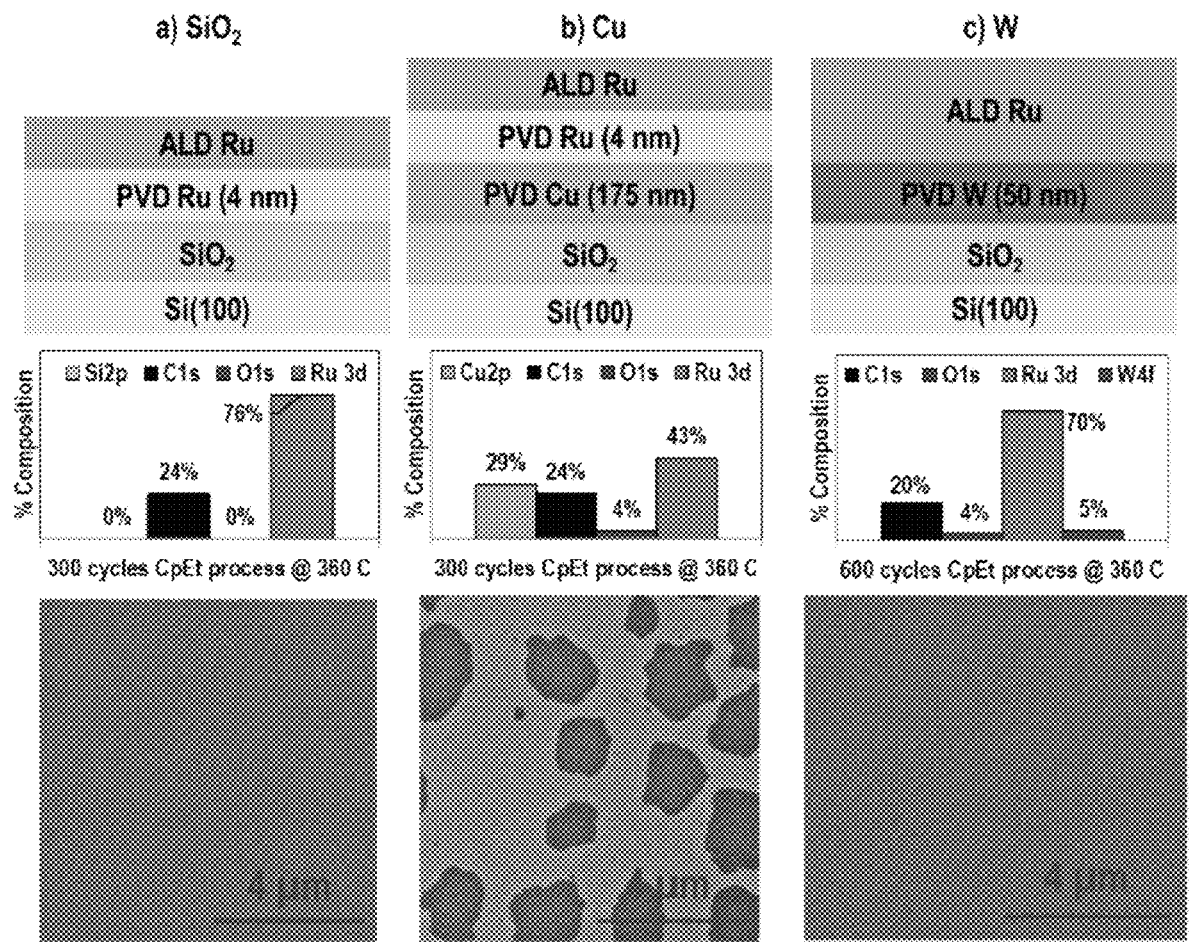
FIG. 9: XPS and SEM of Ru ALD with Ru(CpEt)$_2$+O$_2$ on PVD Ru/SiO$_2$, PVD W/PVD Cu/SiO$_2$, and PVD W/SiO$_2$ surfaces. a) ALD Ru on the PVD Ru seed layer on SiO$_2$ showing a uniform surface, with oxygen below detection limit in XPS and no visible Si substrate. b) ALD Ru on the PVD Ru seed layer on the Cu surface showing the presence of Cu on the surface in XPS, with SEM imagery showing voids in the film after deposition. c) ALD Ru on the PVD W surface showing a similar morphology to the SiO$_2$ surface after deposition, with a small amount of W consistent with pinholes formed due to incomplete native oxide clean.

FIGS. 9a) and 9b) also show top-down SEM images of the film after Ru ALD on the a) PVD Ru/SiO$_2$ and the b) PVD Ru/PVD Cu/SiO$_2$ surfaces. Note that, for the PVD Ru/PVD Cu/SiO$_2$ sample, the Ru and Cu depositions were performed in the same sputter tool without a vacuum break to minimize any CuO$_x$ formation. The ALD Ru film with PVD Ru seed layer on SiO$_2$ appeared uniform, without pinhole formation, while the Ru seed layer on PVD Cu/SiO$_2$ showed voids in the Ru film. Comparison of this result with XPS is consistent with these voids being the underlying Cu surface. To test if this is due to film de-wetting as a result of the difference in surface free energies of Ru (3.0 J/m$^2$) and Cu (1.8 J/m$^2$), a sample was prepared with PVD W/SiO$_2$, (diagram top of FIG. 9c) due to its similar surface free energy (3.2 J/m$^2$) to Ru (Vitos et al. (1998) Surf. Sci. 411, 186). 600 cycles of ALD Ru were deposited via the CpEt process at 360° C. on the PVD W/SiO$_2$ substrate, and SEM of the ALD Ru layer showed a similar morphology to the ALD Ru film deposited on the PVD Ru/SiO$_2$ layer, consistent with the surface free energy mismatch between Cu and Ru being the driving force for the formation of these voids.

Figure 10:
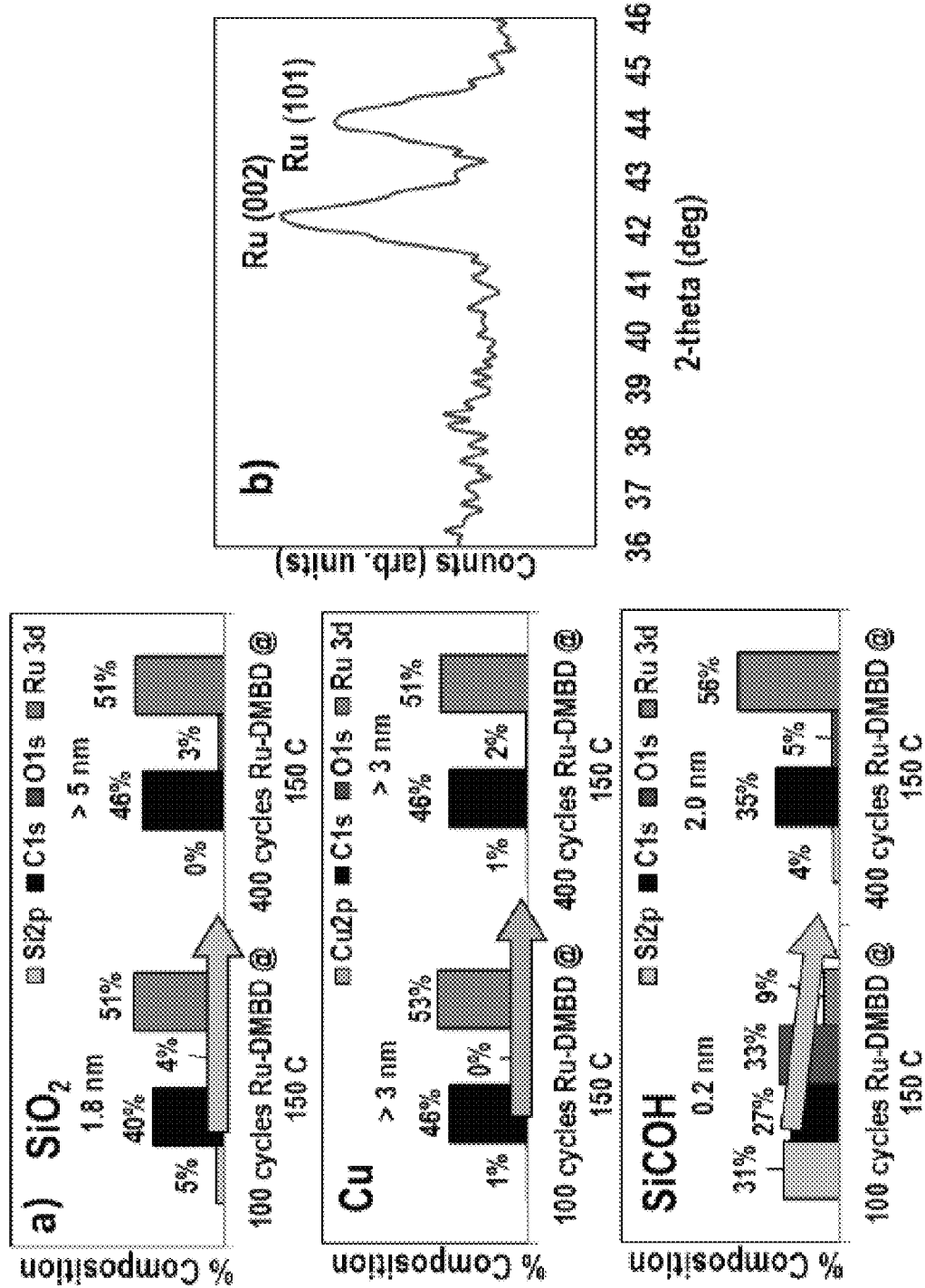
FIG. 10: XPS of Ru ALD with Ru(DMBD)(CO)$_3$+TBA on SiO$_2$, Cu, SiCOH. a) SiO$_2$ substrate completely attenuated by Ru ALD, while on Cu and SiCOH substrates are near-fully attenuated. b) XRD of the film after post-deposition forming gas anneal at 450 C shows a mix of (002) and (101) oriented grains of 11 and 12 nm respectively.

An analysis was performed to see if the de-wetting of ALD Ru from Cu could be bypassed by first depositing an Ru film with a low-temperature ALD process. This low temperature process has a second advantage even for deposition on SiO$_2$ and W. As previously reported, the Ru(DMBD)(CO)$_3$+TBA process has zero nucleation delay even at deposition temperatures as low as 160° C. (Gao et al. (2019 Chem. Mater. 31, 1304; Wolf et al. (2020) Appl. Surf. Sci. 510, 144804). Deposition was performed at a temperature of 150 to 160° C. through a turbomolecular pump for 50 ms at 100 mTorr during dosing of Ru(DMBD)(CO)$_3$ and 15 ms at 1 Torr while dosing TBA. FIG. 10 shows XPS quantification for the deposition of Ru using the Ru-DMBD process at 150° C. after the first 100 cycles and after an additional 400 cycles for a total of 500 cycles deposited. On SiO$_2$ and Cu, the substrate was near-fully attenuated after the first 100 cycles, while SiCOH had a substrate attenuation consistent with sub-monolayer (~0.2 nm) coverage of Ru. After an additional 400 cycles, Cu and SiO$_2$ were fully buried, but some SiCOH substrate signal remained consistent with ~2 nm film thickness. XRR measurement of the film deposited on SiO$_2$ showed a film thickness of 23 nm and density of 7.3 g/cm$^3$, with a sheet resistance of 79Ω/□ for a resistivity of ~180 μΩ·cm. XRD showed no clear crystalline peaks, consistent with the observed high level of C in the film and the measured high resistivity. A 450° C. forming gas anneal was then performed for 30 minutes, after which a sheet resistance of 11Ω/□ was measured. Thickness of the post-anneal film on SiO$_2$ as measured by XRR was 12 nm and density of 11.9 g/cm$^3$, consistent with a resistivity of 12.5 μΩ·cm. XRD of the post FGA film showed the presence of (002) and (101) grain orientations, with Scherrer-equation derived grain sizes of 11 and 12 nm respectively. As shown below, this resistivity can be brought close to bulk by combining the Ru(DMBD)(CO)$_3$+TBA ALD with subsequent Ru(CpEt)$_2$+O$_2$ ALD.

Figure 11:
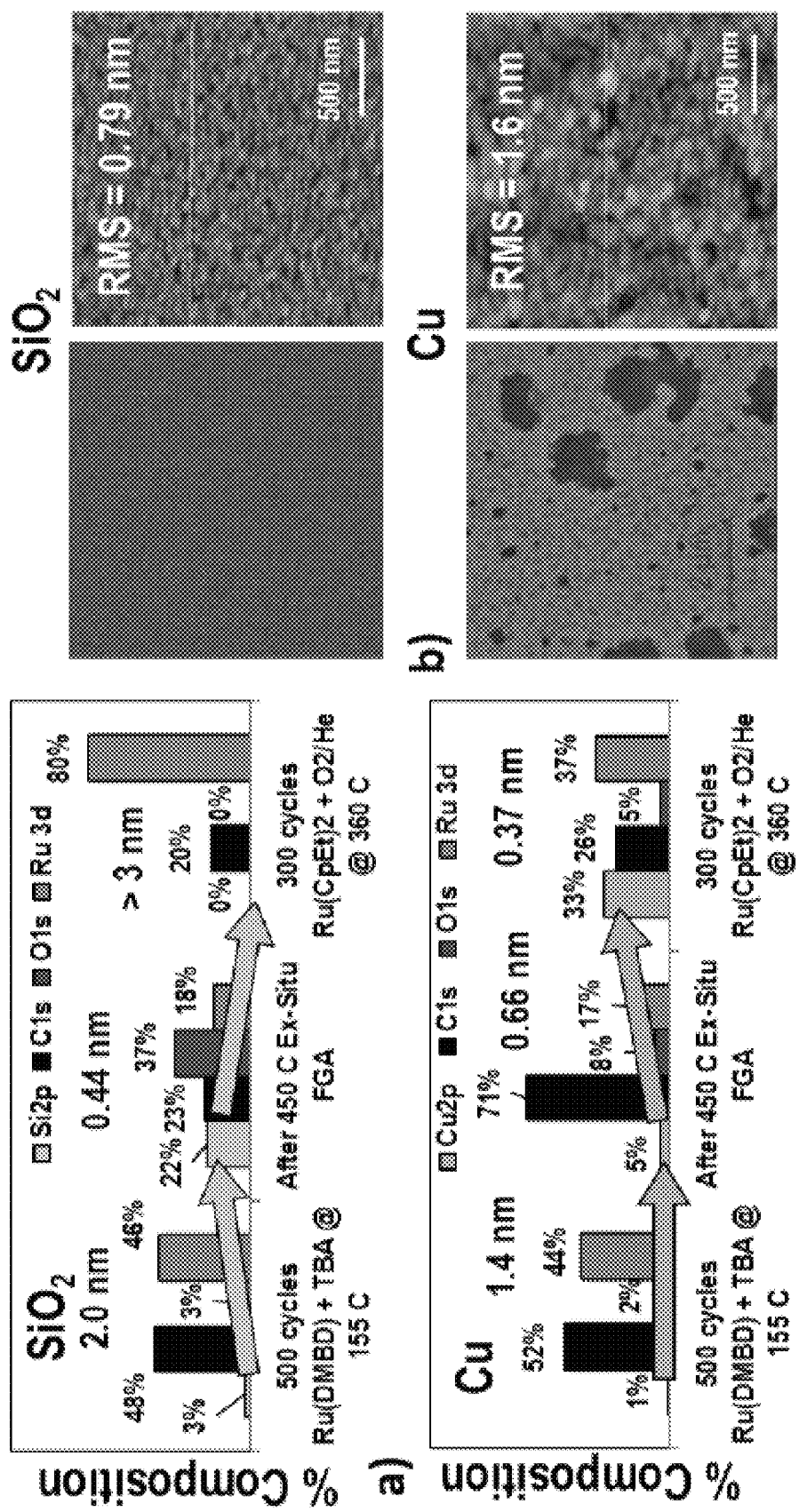
FIG. 11: XPS/SEM/AFM of Ru ALD with the dual ALD process: seed DMBD process+FGA+enhancement CpEt process on SiO$_2$ and Cu. a) After 500 cycles of Ru ALD by the DMBD process at 155° C., substrate attenuation was near-complete. The ex-situ 450° C. FGA caused a reduction in the film thickness, visible in XPS as increased substrate signal. Subsequently, 300 cycles of the CpEt process were deposited at 360° C. b) SEM showed a uniform surface on SiO$_2$ compared with the surface of the Cu, which exhibited voids in the film due to de-wetting. AFM showed clear grains with sub-nanometer roughness on the SiO$_2$, while pinholes were visible in the Cu surface.

Due to the surface de-wetting issue with the high temperature Ru ALD process, it was hypothesized that first depositing a sufficiently thick layer of Ru using the low-temperature Ru-DMBD process could act as a seed layer for the subsequent low-resistivity Ru-CpEt process. As a high level of C in the film along with a low film density were present after the DMBD process, an ex-situ 30 minute 450° C. forming gas anneal was first performed on the seed layer prior to deposition of Ru with the high-temperature CpEt process. This also avoided stress in the films from the densification of the DMBD seed layer while depositing low-resistivity Ru by the CpEt process. FIG. 11a) shows the XPS data after 500 cycles of the Ru-DMBD process, ex-situ FGA, and the subsequent deposition of 300 ALD cycles of Ru by the CpEt process on SiO$_2$ and Cu. After the DMBD process, both substrates were near-fully attenuated. After the FGA, the apparent thickness of the Ru layer decreased from 2 nm to 0.4 nm on SiO$_2$, and from 1.4 nm to 0.7 nm on Cu. After 300 cycles of the CpEt process, the SiO$_2$ substrate was again fully attenuated, but the Cu remained visible.

After CpEt deposition, the film thickness on SiO$_2$ was measured by XRR as 15.4 nm with a sheet resistivity of 6.5Ω/□, corresponding to a film resistivity of 10 μΩ·cm, likely due to the higher resistivity of the DMBD-deposited Ru even after FGA. To further decrease the film resistivity, an additional 30 min 450° C. FGA was performed, decreasing the film resistivity to 8.2 μΩ·cm, a value 10% above that of bulk Ru. FIG. 11(b) shows both SEM images and AFM images of the film on SiO$_2$ and Cu, where a smooth continuous film of sub-nanometer roughness was observed on SiO$_2$. It is hypothesized that the post CpEt process induced the film from the DMBD process to adopt the favorable grain structure of the CpEt process. However, on Cu, the formation of voids in the film was again observed, with the addition of smaller pits likely due to the de-wetting of the film during the ex-situ FGA. AFM roughness of the Ru film on Cu was 2× that of the film on SiO$_2$ over a 2×2 μm region.

Figure 12:
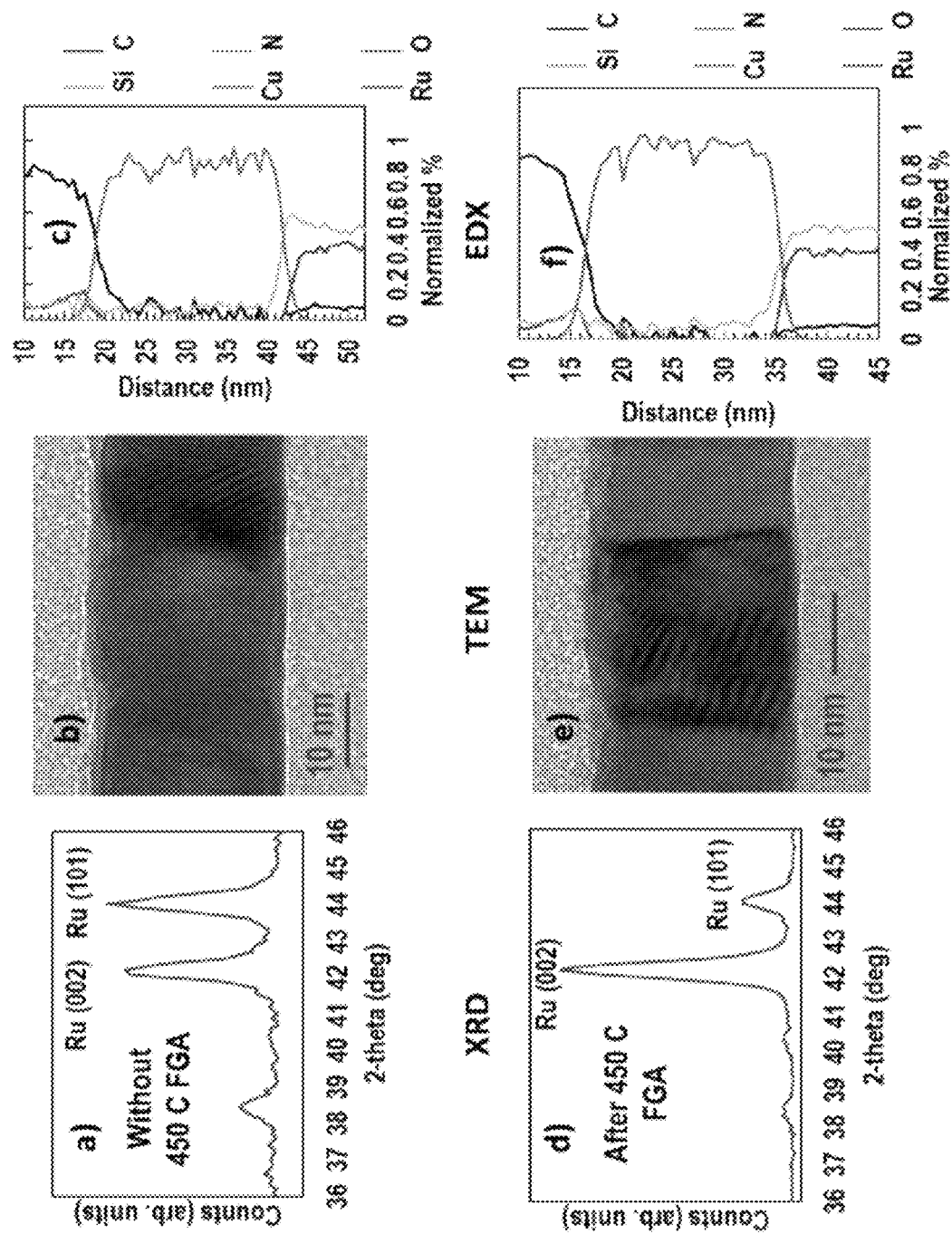
FIG. 12: XRD/TEM/EDX of Ru ALD with the bi-layer ALD process: seed DMBD process+FGA+low-resistivity CpEt process on SiO$_2$. a) Without a post CpEt-process FGA, the relative intensities of the (002) and (101) oriented grains are similar, with grain sizes of 15 and 19 nm respectively. b) TEM image of the film showing both plane orientations c) TEM-EDX shows a layer of Ru 24 nm thick, with no detectible O and 4.8% C average in the film. b) With a post CpEt FGA, the (002) peak is heavily dominant, with grain sizes of 19 nm and 23 nm respectively. TEM shows a clearly defined grain roughly the film thickness in size, with no detectible O and an average C content of 2.4%.

FIG. 12a) shows an XRD scan of the Ru film deposited after a seed layer of the DMBD process at 160° C., followed by an ex-situ FGA and afterward, the CpEt process at 360° C. No post-deposition anneal was performed, and a sheet resistance of 3.5Ω/□ was obtained. By XRD, intensities of both (002) and (101)-oriented grains were observed to be similar, with estimated grain sizes of 15 and 19 nm respectively.

TEM was performed on the bi-layer samples to probe the chemical makeup and grain structure of the film bulk with and without a post CpEt forming gas anneal. In 10b) and c) TEM of the film showed a 23 nm thick Ru film devoid of O, with an average bulk C concentration of 4.8% in the film compared with the value of surface carbon measured during XPS of 20%, highlighting the difficulty of obtaining an accurate fit for C 1s. Given the thickness measured by TEM and the measured sheet resistance, a resistivity value of 8.2 μΩ·cm was measured. In FIG. 12d-e), this deposition was repeated with a post-CpEt process FGA for 30 minutes at 450° C. FIG. 12d) shows a clear difference in intensities between the (002) and (101) peaks, with grain sizes estimated at 19 and 23 nm respectively. Film thickness as measured by XRR was 23 nm, with a sheet resistance measured as 3.0Ω/□, implying a resistivity of 6.9 μΩ·cm. FIG. 12e) contains a EDX line-trace of the film, showing zero O content in the film and C content at an average 2.4% in the film; since the film resistivity is very low, it is hypothesized this carbon is due to contamination during sample preparation of the thin lamella. The data is consistent with CpEt ALD process inducing the film from the DMBD process to adopt the favorable grain structure of the CpEt process as shown by the lack of any boundary in TEM between the DMBD and the CpEt layers and the large grains spanning the full thickness of the film.

Figure 13:
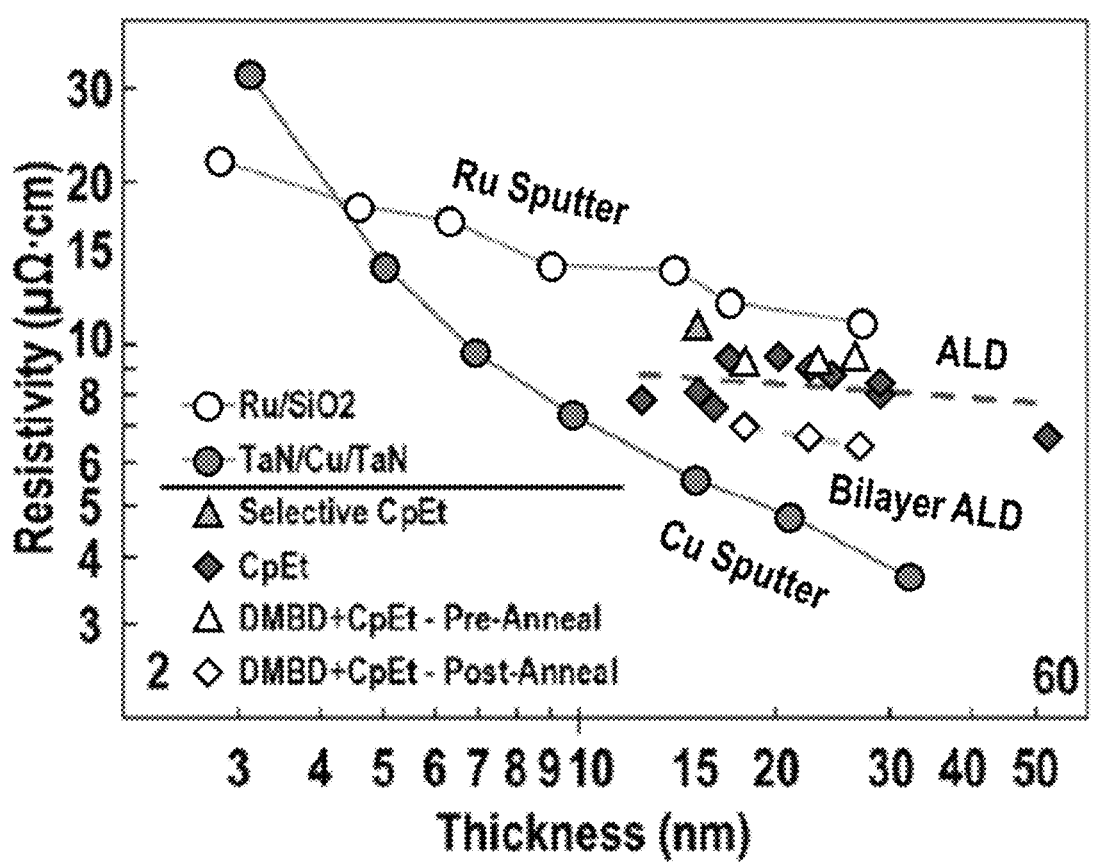
FIG. 13: Comparison of Ru resistivities by thickness and deposition type. Comparison of CpEt-deposited films and bi-layer films (triangles and diamonds) with conventional sputtered Ru films and Cu/TaN films (circles, prepared as described in Dutta et al. (2017) J. Appl. Phys. 122, 025107).

FIG. 13 compares the relationship between film resistivity and film thickness for a set of films deposited by conventional sputtering of Cu and Ru, films deposited by processes outlined in Dutta et al. (2017) J. Appl. Phys. 122, 025107, and films prepared/deposited according to ALD methods as described herein. Ru films prepared according to ALD methods described herein exhibit lower resistivities when compared to Ru films prepared by conventional sputtering (open circles) for the same thickness. Furthermore, post-anneal (30 min. at 450° C. FGA) bi-layer films (open diamonds) prepared according to methods as described herein exhibit a 40% reduction in film resistivity when compared to pre-anneal bi-layer films (open triangles) for the same thickness. The post-anneal films have near-bulk resistivities, the thickest having a resistivity of ~6.4 $\mu\Omega\cdot$cm.

3. Conclusion

Deposition of Ru films by ALD with resistivities close to the bulk value has been demonstrated by the use of a three-step process with a seed layer deposited by an oxygen-free low-temperature Ru ALD process using DMBD and TBA, followed by a post-deposition forming gas anneal of the seed layer, and a thick, high temperature deposition to form large grains with the $Ru(CpEt)_2+O_2$ process. Near-bulk resistivities have been obtained for 30 nm films deposited by the bi-layer process, with XRD confirming the presence of grains of a size close to the film thickness. Cross-sectional TEM shows the width of grains throughout the film thickness remaining constant within 20%, consistent with continuous grains spanning the full thickness of the film. Comparison of this result with the measured low sheet resistance is consistent with the underlying Ru seed layer adopting the larger grain structure of the low-resistivity $O_2$-based Ru ALD process after FGA, forming continuous large grains spanning the full film thickness, improving out-of-plane electron transport with a corresponding decrease in resistivity. With optimized ALD conditions, these processes allow for preparing and using low resistivity Ru layers/films in barrierless via-fills, as well as M0/M1 interconnect layers, such as M0/M1 interconnect layers having metals with surface-free-energies close to that of Ru, for example, W.

Whereas specific embodiments of the present inventive concept have been shown and described, it will be understood that other modifications, substitutions, and alternatives are apparent to one of ordinary skill in the art. Such modifications, substitutions and alternatives can be made without departing from the spirit and scope of the inventive concept, which should be determined from the appended claims.

The invention claimed is:

1. An ALD method of depositing a metal layer on a substrate comprising:
   exposing the substrate to at least one cycle of:
   a) a first metal-organic precursor; and
   b) a first co-reactant,
   to provide a seed layer on the substrate, followed by exposing the seed layer to at least one cycle of:
   d) a second metal-organic precursor; and
   e) a second co-reactant,
   to provide a metal layer on the substrate with a resistivity in a range of about 5.8-8.6 $\mu\Omega\cdot$cm, wherein the metal layer comprises ruthenium (Ru).

2. The method of claim 1, wherein the first metal-organic precursor comprises n-4,2,3-dimethylbutadiene ruthenium tricarbonyl $(Ru(DMBD)(CO)_3)$.

3. The method of claim 1, wherein the first co-reactant comprises tert-butyl amine (TBA).

4. The method of claim 1, wherein the second metal-organic precursor comprises bis-ethylcyclopentadienyl ruthenium $(Ru(CpEt)_2$.

5. The method of claim 1, wherein the second co-reactant comprises $O_2$.

6. The method of claim 1, wherein the method further comprises:
   annealing the seed layer after completing the at least one cycle or cycles of exposing the substrate to the first metal-organic precursor and first co-reactant.

7. The method of claim 6, wherein annealing the seed layer after completing the at least one cycle or cycles of exposing the substrate to the first metal-organic precursor and first co-reactant comprises a forming gas anneal (FGA).

8. The method of claim 1, wherein the method further comprises:
   annealing the metal layer after completing the at least one cycle or cycles of exposing the seed layer to the second metal-organic precursor and second co-reactant.

9. The method of claim 8, wherein annealing the metal layer after completing the at least one cycle or cycles of exposing the seed layer to the second metal-organic precursor and second co-reactant comprises an FGA.

10. The method of claim 1, wherein the metal layer has a thickness between about 3-100 nm.

11. The metal layer on the substrate prepared by the method of claim 1.

12. An ALD method of depositing an Ru layer on an $SiO_2$, Si, SiCOH, Cu, or W substrate comprising:
   at least one cycle of exposing the substrate to:
   a) a $Ru(DMBD)(CO)_3$ metal-organic precursor; and
   b) a TBA co-reactant,
   to provide a seed layer on the substrate, followed by at least one cycle of exposing the seed layer to:
   d) an $Ru(CpEt)_2$ metal-organic precursor; and
   e) an $O_2$ co-reactant,
   to provide an Ru layer on the substrate, followed by:
   annealing the Ru layer with an FGA to provide the Ru layer with a resistivity in a range of about 5.8-8.6$\mu\Omega\cdot$cm.

13. The method of claim 12, wherein the method further comprises:
   annealing the seed layer on the substrate with an FGA prior to exposing the seed layer to the $Ru(CpEt)_2$ metal-organic precursor and the $O_2$ co-reactant.

14. The method of claim 12, wherein the method further comprises:
   annealing the substrate in an UHV prior exposing the substrate to the $Ru(DMBD)(CO)_3$ metal-organic precursor and the TBA co-reactant.

15. The method of claim 12, wherein the Ru layer has a thickness of about 3-60 nm.

16. The method of claim 12, wherein the substrate is $SiO_2$, Si, or SiCOH.

17. The method of claim 16, wherein the substrate is $SiO_2$.

18. The method of claim 16, wherein the substrate is W.

19. A Ru layer on the substrate prepared by the method of claim 12.

* * * * *